United States Patent
Kanamarlapudi et al.

(10) Patent No.: US 12,004,009 B2
(45) Date of Patent: Jun. 4, 2024

(54) METHODS AND APPARATUS FOR MANAGING COMPRESSOR MEMORY

(71) Applicant: QUALCOMM Incorporated, San Diego, CA (US)

(72) Inventors: Sitaramanjaneyulu Kanamarlapudi, San Diego, CA (US); Leena Zacharias, San Jose, CA (US); Prasad Reddy Kadiri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 184 days.

(21) Appl. No.: 17/246,006

(22) Filed: Apr. 30, 2021

(65) Prior Publication Data

US 2021/0345177 A1 Nov. 4, 2021

Related U.S. Application Data

(60) Provisional application No. 63/019,909, filed on May 4, 2020.

(51) Int. Cl.
*H04W 28/06* (2009.01)
*H04L 49/552* (2022.01)

(52) U.S. Cl.
CPC ......... *H04W 28/065* (2013.01); *H04L 49/552* (2013.01)

(58) Field of Classification Search
None
See application file for complete search history.

(56) References Cited

U.S. PATENT DOCUMENTS

| 6,629,108 B2 * | 9/2003 | Frey ................. G06F 11/2056 |
| 7,603,418 B1 * | 10/2009 | Xu .................... H04L 49/552 |
| | | 370/231 |
| 8,219,747 B2 * | 7/2012 | Mizuno ............... G06F 13/10 |
| | | 714/48 |

(Continued)

FOREIGN PATENT DOCUMENTS

| EP | 3713182 A1 | 9/2020 |
| WO | 2019095989 A1 | 5/2019 |

OTHER PUBLICATIONS

International Search Report and Written Opinion—PCT/US2021/030488—ISA/EPO—dated Aug. 19, 2021.

*Primary Examiner* — Khaled M Kassim
*Assistant Examiner* — Berhanu D Belete
(74) *Attorney, Agent, or Firm* — Shumaker & Sieffert, P.A.

(57) ABSTRACT

Aspects of the present disclosure include methods, apparatuses, and computer readable media for transmitting, to a receiving device, a first plurality of packets immediately after a first compression memory reset, transmitting, to the receiving device, a second plurality of packets different than the first plurality of packets, receiving, from the receiving device, a memory reset request associated with a second plurality of packets for a second compression memory reset, wherein the memory reset request comprises one or more recent sequence numbers of the second plurality of packets, and refraining from performing a second compression memory reset in response to determining that the at least one of the one or more recent sequence numbers is less than at least one of one or more reset sequence numbers of the first plurality of packets.

30 Claims, 19 Drawing Sheets

(56) References Cited

U.S. PATENT DOCUMENTS

| | | | |
|---|---|---|---|
| 9,600,191 B2* | 3/2017 | Pawlowski | G06F 11/07 |
| 10,102,148 B2* | 10/2018 | Bak | G06F 12/126 |
| 2013/0266140 A1* | 10/2013 | Wall | H04M 15/48 |
| | | | 380/255 |
| 2014/0149605 A1* | 5/2014 | Annamalaisami | H04L 41/00 |
| | | | 709/247 |
| 2014/0372715 A1* | 12/2014 | Bak | G06F 12/126 |
| | | | 711/158 |
| 2016/0063967 A1* | 3/2016 | Reinhold | G09G 3/2003 |
| | | | 345/531 |
| 2016/0309364 A1* | 10/2016 | Maheshwari | H03M 7/30 |
| 2018/0323913 A1* | 11/2018 | Chen | H04L 5/0055 |
| 2019/0141567 A1* | 5/2019 | Liu | H04L 69/04 |
| 2019/0141571 A1 | 5/2019 | Kim et al. | |
| 2019/0238661 A1* | 8/2019 | Raina | H04L 69/24 |
| 2021/0120033 A1* | 4/2021 | Gorrepati | H04L 9/0637 |

* cited by examiner

METHODS AND APPARATUS FOR MANAGING COMPRESSOR MEMORY

CROSS-REFERENCE TO RELATED APPLICATIONS

The current application claims priority to, and the benefit of, U.S. Provisional Application No. 63/019,909 filed on May 4, 2020, entitled "Methods and Apparatus for Managing Compressor Memory," the contents of which are hereby incorporated by reference in their entireties.

BACKGROUND

Aspects of the present disclosure relate generally to wireless communications, and more particularly, to apparatuses and methods for managing compressor memory.

Wireless communication networks are widely deployed to provide various types of communication content such as voice, video, packet data, messaging, broadcast, and so on. These systems may be multiple-access systems capable of supporting communication with multiple users by sharing the available system resources (e.g., time, frequency, and power). Examples of such multiple-access systems include code-division multiple access (CDMA) systems, time-division multiple access (TDMA) systems, frequency-division multiple access (FDMA) systems, orthogonal frequency-division multiple access (OFDMA) systems, and single-carrier frequency division multiple access (SC-FDMA) systems.

These multiple access technologies have been adopted in various telecommunication standards to provide a common protocol that enables different wireless devices to communicate on a municipal, national, regional, and even global level. For example, a fifth generation (5G) wireless communications technology (which may be referred to as new radio (NR)) is envisaged to expand and support diverse usage scenarios and applications with respect to current mobile network generations. In an aspect, 5G communications technology may include: enhanced mobile broadband addressing human-centric use cases for access to multimedia content, services and data; ultra-reliable-low latency communications (URLLC) with certain specifications for latency and reliability; and massive machine type communications, which may allow a very large number of connected devices and transmission of a relatively low volume of non-delay-sensitive information. As the demand for mobile broadband access continues to increase, however, further improvements in NR communications technology and beyond may be desired.

In a wireless communication network, a transmitting device (such as a user equipment (UE) or a base station (BS)) may transmit information to a receiving device. In order to reduce the bandwidth allocated for the transmission of the information, the transmitting device may utilize compression algorithms to reduce the amount of resources for the transmission. Utilizing compression algorithms may lead to some data blocks being undecompressible due to lost blocks, which may trigger a compressor memory reset at the transmitting device. However, in some circumstances, it may be unnecessary to reset the compressor memory. Therefore, improvements may be desirable.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of the present disclosure include methods including transmitting, to a receiving device, a first plurality of packets immediately after a first compression memory reset, wherein the first plurality of packets is transmitted as a burst transmission, transmitting, to the receiving device, a second plurality of packets different than the first plurality of packets, receiving, from the receiving device, a memory reset request associated with the second plurality of packets for a second compression memory reset, wherein the memory reset request comprises one or more recent sequence numbers of the second plurality of packets, determining whether at least one of the one or more recent sequence numbers is less than or greater than or equal to at least one of one or more reset sequence numbers of the first plurality of packets, and refraining from performing a second compression memory reset in response to determining that the at least one of the one or more recent sequence numbers is less than at least one of one or more reset sequence numbers of the first plurality of packets.

Other aspects of the present disclosure include a transmitting device having a memory comprising instructions, a transceiver, and one or more processors operatively coupled with the memory and the transceiver, the one or more processors configured to execute instructions in the memory to transmit, to a receiving device, a first plurality of packets immediately after a first compression memory reset, wherein the first plurality of packets is transmitted as a burst transmission, transmit, to the receiving device, a second plurality of packets different than the first plurality of packets, receive, from the receiving device, a memory reset request associated with the second plurality of packets for a second compression memory reset, wherein the memory reset request comprises one or more recent sequence numbers of the second plurality of packets, determine whether at least one of the one or more recent sequence numbers is less than or greater than or equal to at least one of one or more reset sequence numbers of the first plurality of packets, and refrain from performing a second compression memory reset in response to determining that the at least one of the one or more recent sequence numbers is less than at least one of one or more reset sequence numbers of the first plurality of packets.

An aspect of the present disclosure includes a transmitting device including means for transmitting, to a receiving device, a first plurality of packets immediately after a first compression memory reset, wherein the first plurality of packets is transmitted as a burst transmission, means for transmitting, to the receiving device, a second plurality of packets different than the first plurality of packets, means for receiving, from the receiving device, a memory reset request associated with the second plurality of packets for a second compression memory reset, wherein the memory reset request comprises one or more recent sequence numbers of the second plurality of packets, means for determining whether at least one of the one or more recent sequence numbers is less than or greater than or equal to at least one of one or more reset sequence numbers of the first plurality of packets, and means for refraining from performing a second compression memory reset in response to determining that the at least one of the one or more recent sequence numbers is less than at least one of one or more reset sequence numbers of the first plurality of packets.

Some aspects of the present disclosure include non-transitory computer readable media having instructions stored therein that, when executed by one or more processors of a transmitting device, cause the one or more processors to transmit, to a receiving device, a first plurality of packets immediately after a first compression memory reset, transmit, wherein the first plurality of packets is transmitted as a burst transmission, to the receiving device, a second plurality of packets different than the first plurality of packets, receive, from the receiving device, a memory reset request associated with the second plurality of packets for a second compression memory reset, wherein the memory reset request comprises one or more recent sequence numbers of the second plurality of packets, determine whether at least one of the one or more recent sequence numbers is less than or greater than or equal to at least one of one or more reset sequence numbers of the first plurality of packets, and refrain from performing a second compression memory reset in response to determining that the at least one of the one or more recent sequence numbers is less than at least one of one or more reset sequence numbers of the first plurality of packets.

Aspects of the present disclosure include methods including receiving, from a transmitting device, a first plurality of packets, receiving, from the transmitting device, a second plurality of packets immediately after a first compression memory reset, wherein the second plurality of packets is different than the first plurality of packets, determining a checksum failure associated with the second plurality of packets, determining whether at least one of one or more recent sequence numbers of the first plurality of packets is less than or greater than or equal to at least one of one or more reset sequence numbers of the second plurality of packets, and refraining from transmitting a memory reset request for a second compression memory reset associated with the checksum failure in response to determining that the at least one of one or more recent sequence numbers is less than the at least one of one or more reset sequence numbers.

Other aspects of the present disclosure include a receiving device having a memory comprising instructions, a transceiver, and one or more processors operatively coupled with the memory and the transceiver, the one or more processors configured to execute instructions in the memory to receive, from a transmitting device, a first plurality of packets, receive, from the transmitting device, a second plurality of packets immediately after a first compression memory reset, wherein the second plurality of packets is different than the first plurality of packets, determine a checksum failure associated with the second plurality of packets, determine whether at least one of one or more recent sequence numbers of the first plurality of packets is less than or greater than or equal to at least one of one or more reset sequence numbers of the second plurality of packets, and refrain from transmitting a memory reset request for a second compression memory reset associated with the checksum failure in response to determining that the at least one of one or more recent sequence numbers is less than the at least one of one or more reset sequence numbers.

An aspect of the present disclosure includes a receiving device including means for receiving, from a transmitting device, a first plurality of packets, means for receiving, from the transmitting device, a second plurality of packets immediately after a first compression memory reset, wherein the second plurality of packets is different than the first plurality of packets, means for determining a checksum failure associated with the second plurality of packets, means for determining whether at least one of one or more recent sequence numbers of the first plurality of packets is less than or greater than or equal to at least one of one or more reset sequence numbers of the second plurality of packets, and means for refraining from transmitting a memory reset request for a second compression memory reset associated with the checksum failure in response to determining that the at least one of one or more recent sequence numbers is less than the at least one of one or more reset sequence numbers Some aspects of the present disclosure include non-transitory computer readable media having instructions stored therein that, when executed by one or more processors of a receiving device, cause the one or more processors to receive, from a transmitting device, a first plurality of packets, receive, from the transmitting device, a second plurality of packets immediately after a first compression memory reset, wherein the second plurality of packets is different than the first plurality of packets, determine a checksum failure associated with the second plurality of packets, determine whether at least one of one or more recent sequence numbers of the first plurality of packets is less than or greater than or equal to at least one of one or more reset sequence numbers of the second plurality of packets, and refrain from transmitting a memory reset request for a second compression memory reset associated with the checksum failure in response to determining that the at least one of one or more recent sequence numbers is less than the at least one of one or more reset sequence numbers.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
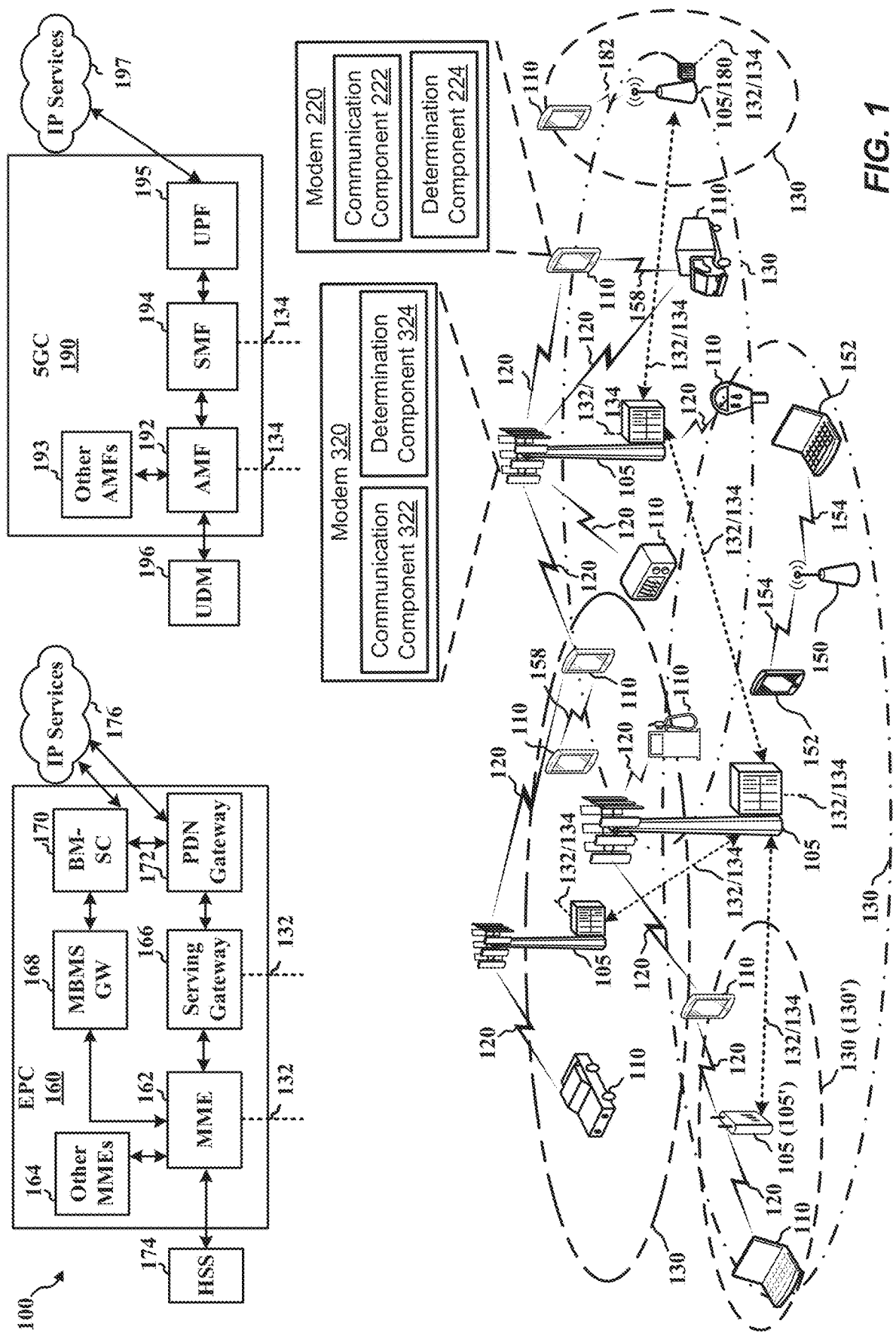
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that may be accessed by a computer. By way of example, and not limitation, such computer-readable media may comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that may be used to store computer executable code in the form of instructions or data structures that may be accessed by a computer.

In certain aspects of the present disclosure, a transmitting device, upon receiving a memory reset request comprising a recent sequence number (SN) of a first data unit associated with the memory reset request, may determine if a reset SN of a second data unit associated with the previous memory reset is greater than or less than the recent SN. The transmitting device may perform the memory request if the reset SN is smaller than the recent SN. The transmitting device may not perform the memory reset if the reset SN is greater than the recent SN.

In another aspect of the present disclosure, a receiving device, upon determining a compression checksum failure of a failure SN associated with a first data unit, may determine if the failure SN is smaller than a current SN of a first data unit associated with data transmitted by a transmitting device immediately after the a memory reset. If the failure SN is smaller than the current SN, the receiving device may cancel a new memory reset request associated with the failure SN.

In some instances, a deflating algorithm may be used on uncompressed data to reduce transmission bandwidth consumption. In the deflating algorithm, uncompressed data may be divided into series of consecutive blocks. Block sizes may be different. Non compressible block maximum size allowed may be 65,535 Bytes. Each block may undergo LZ77 Algorithm and/or Huffman Coding. LZ77 algorithm (i.e., an example of a dictionary coder) may use reference to duplicated string in previous block(s), e.g., up to 32K input bytes before. Huffman Trees for each block may be independent of other blocks. A Huffman Tree may describe the representation of the compressed data. The compressed data part may include literal bytes (e.g., strings which are not duplicated based on previous data) and pointers to duplicate strings (e.g., length and backward distance). In one example, one code tree may be used for literals and lengths, and another code tree for distances.

In one instance, new radio (NR) radio link control (RLC) acknowledge mode (AM) may recover the missing packets through a RLC automatic repeat request (ARQ) mechanism. NR RLC operating in AM mode may deliver packets out-of-order to NR packet data convergence protocol (PDCP), which may help the NR PDCP split bearer case, when data is arriving through the master cell group (MCG) and/or secondary cell group (SCG) medium access control (MAC) and/or RLC entities. NR PDCP may have a reordering window mechanism and timer mechanism ($t_{reordering}$) to move the reordering window as an additional trigger. In some cases, PDCP may not get all the packets in-sequence in the reordering window and, after $t_{reordering}$ has expired, moves the reordering window to the right (e.g., based on state variables) and delivers packets to upper layers with some missing packets. After the PDCP window movement, even though RLC may recover through ARQ mechanism, PDCP may discard those packets as "Out-Of-Window." NR PDCP may perform decipher and integrity verification in standalone manner on every packet, even with missing packets. But during NR PDCP Data decompression based on the algorithm above, if the previous packets are lost, the current PDCP packet may not be able to successfully decompressed because the current PDCP packet may not be able to reference at least a portion of the previous lost packets.

FIG. 1 is a diagram illustrating an example of a wireless communications system and an access network 100. The wireless communications system (also referred to as a wireless wide area network (WWAN)) includes at least one BS 105, UEs 110, an Evolved Packet Core (EPC) 160, and a 5G Core (5GC) 190. The BS 105 may include macro cells (high power cellular base station) and/or small cells (low power cellular base station). The macro cells include base stations. The small cells include femtocells, picocells, and microcells. In one implementation, the UE 110 may include a communication component 222. The communication component 222 and/or a modem 220 of the UE 110 may be configured to communicate with the BS 105 via a cellular network, a Wi-Fi network, or other wireless and wired networks. The UE 110 may include a determination component 324 that compares the sequence numbers of a first transmission with the sequence numbers of a second transmission. In some implementations, the BS 105 may include a communication component 322 configured to communicate with the UE 110. The BS 105 may include a determination component 324 that compares the sequence numbers of a first transmission with the sequence numbers of a second transmission.

A BS 105 configured for 4G LTE (collectively referred to as Evolved Universal Mobile Telecommunications System (UMTS) Terrestrial Radio Access Network (E-UTRAN)) may interface with the EPC 160 through backhaul links interfaces 132 (e.g., S1, X2, Internet Protocol (IP), or flex interfaces). A BS 105 configured for 5G NR (collectively referred to as Next Generation RAN (NG-RAN)) may interface with 5GC 190 through backhaul links interfaces 134 (e.g., S1, X2, Internet Protocol (IP), or flex interface). In addition to other functions, the BS 105 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The BS 105 may communicate directly or indirectly (e.g., through the EPC 160 or 5GC 190) with each other over the backhaul links interfaces 134. The backhaul links 132, 134 may be wired or wireless.

The BS 105 may wirelessly communicate with the UEs 110. Each of the BS 105 may provide communication coverage for a respective geographic coverage area 130. There may be overlapping geographic coverage areas 130. For example, the small cell 105' may have a coverage area 130' that overlaps the coverage area 130 of one or more macro BS 105. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the BS 105 and the UEs 110 may include uplink (UL) (also referred to as reverse link) transmissions from a UE 110 to a BS 105 and/or downlink (DL) (also referred to as forward link) transmissions from a BS 105 to a UE 110. The communication links 120 may use multiple-input and multiple-output (MIMO) antenna technology, including spatial multiplexing, beamforming, and/or transmit diversity. The communication links may be through one or more carriers. The BS 105/UEs 110 may use spectrum up to Y MHz (e.g., 5, 10, 15, 20, 100, 400, etc. MHz) bandwidth per carrier allocated in a carrier aggregation of up to a total of $Y_x$ MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 110 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 105' may operate in a licensed and/or an unlicensed frequency spectrum. When operating in an unlicensed frequency spectrum, the small cell 105' may employ NR and use the same 5 GHz unlicensed frequency spectrum as used by the Wi-Fi AP 150. The small cell 105', employing NR in an unlicensed frequency spectrum, may boost coverage to and/or increase capacity of the access network.

A BS 105, whether a small cell 105' or a large cell (e.g., macro base station), may include an eNB, gNodeB (gNB), or other type of base station. Some base stations, such as gNB 180 may operate in a traditional sub 6 GHz spectrum, in millimeter wave (mmW) frequencies, and/or near mmW frequencies in communication with the UE 110. When the gNB 180 operates in mmW or near mmW frequencies, the gNB 180 may be referred to as an mmW base station.

Extremely high frequency (EHF) is part of the radio frequency (RF) in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 182 with the UE 110 to compensate for the path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 110 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the BS 105 belonging to a Multicast Broadcast Single Frequency Network (MBSFN) area broadcasting a particular service, and may be responsible for session management (start/stop) and for collecting eMBMS related charging information.

The 5GC 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 110 and the 5GC 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a PS Streaming Service, and/or other IP services.

The BS 105 may also be referred to as a gNB, Node B, evolved Node B (eNB), an access point, a base transceiver station, a radio base station, an access point, an access node, a radio transceiver, a NodeB, eNodeB (eNB), gNB, Home NodeB, a Home eNodeB, a relay, a transceiver function, a basic service set (BSS), an extended service set (ESS), a transmit reception point (TRP), or some other suitable terminology. The BS 105 provides an access point to the EPC 160 or 5GC 190 for a UE 110. Examples of UEs 110 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 110 may be referred to as IoT devices (e.g., parking meter, gas pump, toaster, vehicles, heart monitor, etc.). The UE 110 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Figure 2:
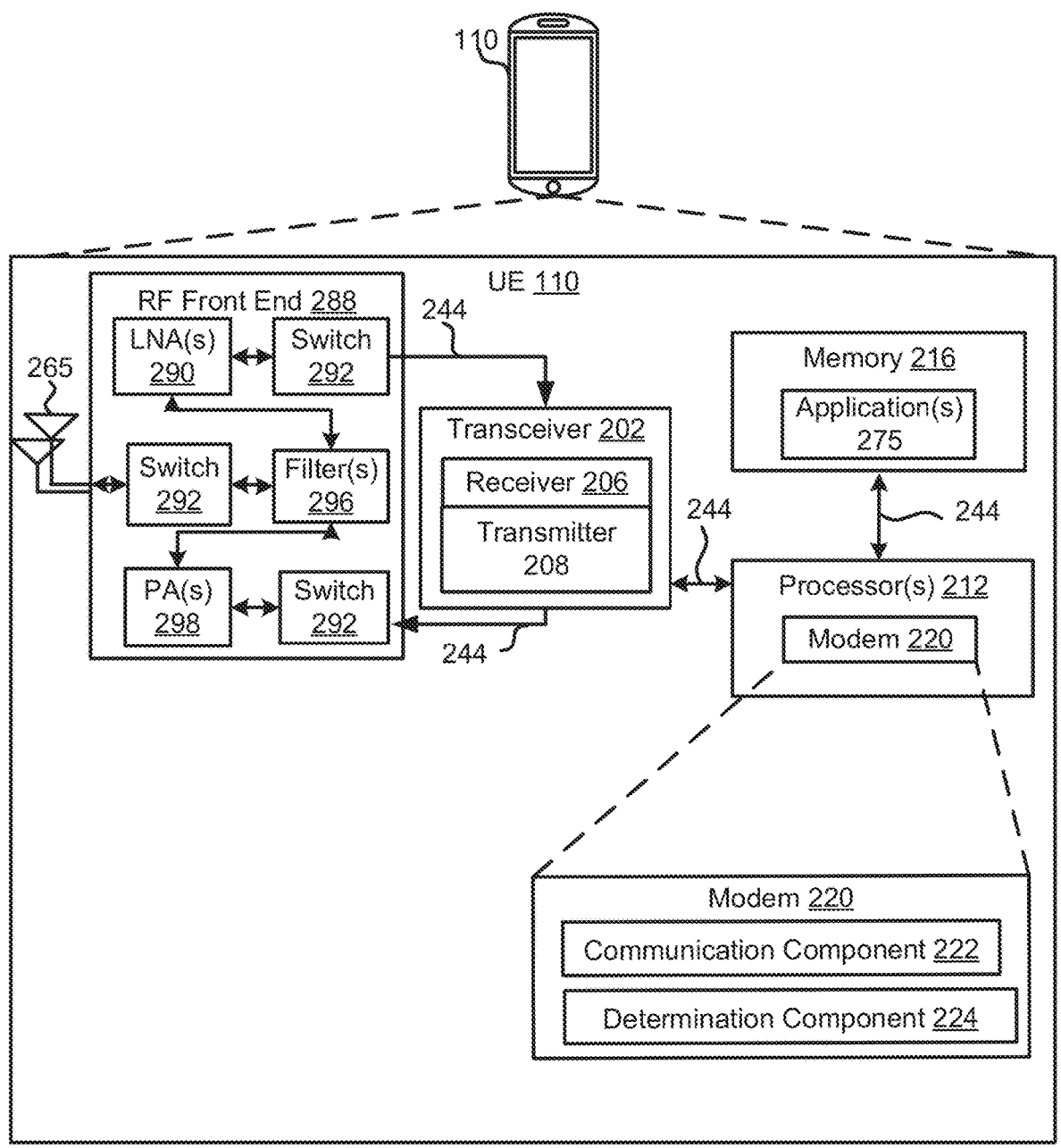
FIG. 2 is a schematic diagram of an example of a user equipment.

Referring to FIG. 2, one example of an implementation of the UE 110 may include a modem 220 having a communication component 222. The communication component 222 and/or the modem 220 of the UE 110 may be configured to communicate with the BS 105 via a cellular network, a Wi-Fi network, or other wireless and wired networks. The UE 110 may include a determination component 324 that compares the sequence numbers of a first transmission with the sequence numbers of a second transmission.

In some implementations, the UE 110 may include a variety of components, including components such as one or more processors 212 and memory 216 and transceiver 202 in communication via one or more buses 244, which may operate in conjunction with the modem 220 and the communication component 222 to enable one or more of the functions described herein related to communicating with the BS 105. Further, the one or more processors 212, modem 220, memory 216, transceiver 202, RF front end 288 and one or more antennas 265, may be configured to support voice and/or data calls (simultaneously or non-simultaneously) in one or more radio access technologies. The one or more antennas 265 may include one or more antennas, antenna elements and/or antenna arrays.

In an aspect, the one or more processors 212 may include the modem 220 that uses one or more modem processors. The various functions related to the communication component 222 and/or the determination component 324 may be included in the modem 220 and/or processors 212 and, in an aspect, may be executed by a single processor, while in other aspects, different ones of the functions may be executed by a combination of two or more different processors. For example, in an aspect, the one or more processors 212 may include any one or any combination of a modem processor, or a baseband processor, or a digital signal processor, or a transmit processor, or a receiving device processor, or a transceiver processor associated with transceiver 202. Additionally, the modem 220 may configure the UE 110 along with the processors 212. In other aspects, some of the features of the one or more processors 212 and/or the modem 220 associated with the communication component 222 may be performed by transceiver 202.

Also, memory 216 may be configured to store data used herein and/or local versions of applications 275 or the communication component 222, the determination component 324, and/or one or more subcomponents of the communication component 222 and/or the determination component 324 being executed by at least one processor 212. Memory 216 may include any type of computer-readable medium usable by a computer or at least one processor 212, such as random access memory (RAM), read only memory (ROM), tapes, magnetic discs, optical discs, volatile memory, non-volatile memory, and any combination thereof. In an aspect, for example, memory 216 may be a non-transitory computer-readable storage medium that stores one or more computer-executable codes defining the communication component 222 and/or one or more of its subcomponents, and/or data associated therewith, when UE 110 is operating at least one processor 212 to execute the communication component 222, the determination component 324, and/or one or more of the subcomponents.

Transceiver 202 may include at least one receiver 206 and at least one transmitter 208. Receiver 206 may include hardware, firmware, and/or software code executable by a processor for receiving data, the code comprising instructions and being stored in a memory (e.g., computer-readable medium). Receiver 206 may be, for example, a RF receiving device. In an aspect, the receiver 206 may receive signals transmitted by at least one BS 105. Transmitter 208 may include hardware, firmware, and/or software code executable by a processor for transmitting data, the code comprising instructions and being stored in a memory (e.g., computer-readable medium). A suitable example of transmitter 208 may including, but is not limited to, an RF transmitter.

Moreover, in an aspect, UE 110 may include RF front end 288, which may operate in communication with one or more antennas 265 and transceiver 202 for receiving and transmitting radio transmissions, for example, wireless communications transmitted by at least one BS 105 or wireless transmissions transmitted by UE 110. RF front end 288 may be coupled with one or more antennas 265 and may include one or more low-noise amplifiers (LNAs) 290, one or more switches 292, one or more power amplifiers (PAs) 298, and one or more filters 296 for transmitting and receiving RF signals.

In an aspect, LNA 290 may amplify a received signal at a desired output level. In an aspect, each LNA 290 may have a specified minimum and maximum gain values. In an aspect, RF front end 288 may use one or more switches 292 to select a particular LNA 290 and the specified gain value based on a desired gain value for a particular application.

Further, for example, one or more PA(s) 298 may be used by RF front end 288 to amplify a signal for an RF output at a desired output power level. In an aspect, each PA 298 may have specified minimum and maximum gain values. In an aspect, RF front end 288 may use one or more switches 292 to select a particular PA 298 and the specified gain value based on a desired gain value for a particular application.

Also, for example, one or more filters 296 may be used by RF front end 288 to filter a received signal to obtain an input RF signal. Similarly, in an aspect, for example, a respective filter 296 may be used to filter an output from a respective PA 298 to produce an output signal for transmission. In an aspect, each filter 296 may be coupled with a specific LNA 290 and/or PA 298. In an aspect, RF front end 288 may use one or more switches 292 to select a transmit or receive path using a specified filter 296, LNA 290, and/or PA 298, based on a configuration as specified by transceiver 202 and/or processor 212.

As such, transceiver 202 may be configured to transmit and receive wireless signals through one or more antennas 265 via RF front end 288. In an aspect, transceiver may be tuned to operate at specified frequencies such that UE 110 may communicate with, for example, one or more BS 105 or one or more cells associated with one or more BS 105. In an aspect, for example, the modem 220 may configure transceiver 202 to operate at a specified frequency and power level based on the UE configuration of the UE 110 and the communication protocol used by the modem 220.

In an aspect, the modem 220 may be a multiband-multimode modem, which may process digital data and communicate with transceiver 202 such that the digital data is sent and received using transceiver 202. In an aspect, the modem 220 may be multiband and be configured to support multiple frequency bands for a specific communications protocol. In an aspect, the modem 220 may be multimode and be configured to support multiple operating networks and communications protocols. In an aspect, the modem 220 may control one or more components of UE 110 (e.g., RF front end 288, transceiver 202) to enable transmission and/or reception of signals from the network based on a specified modem configuration. In an aspect, the modem configuration may be based on the mode of the modem and the frequency band in use. In another aspect, the modem configuration may be based on UE configuration information associated with UE 110 as provided by the network.

Figure 3:
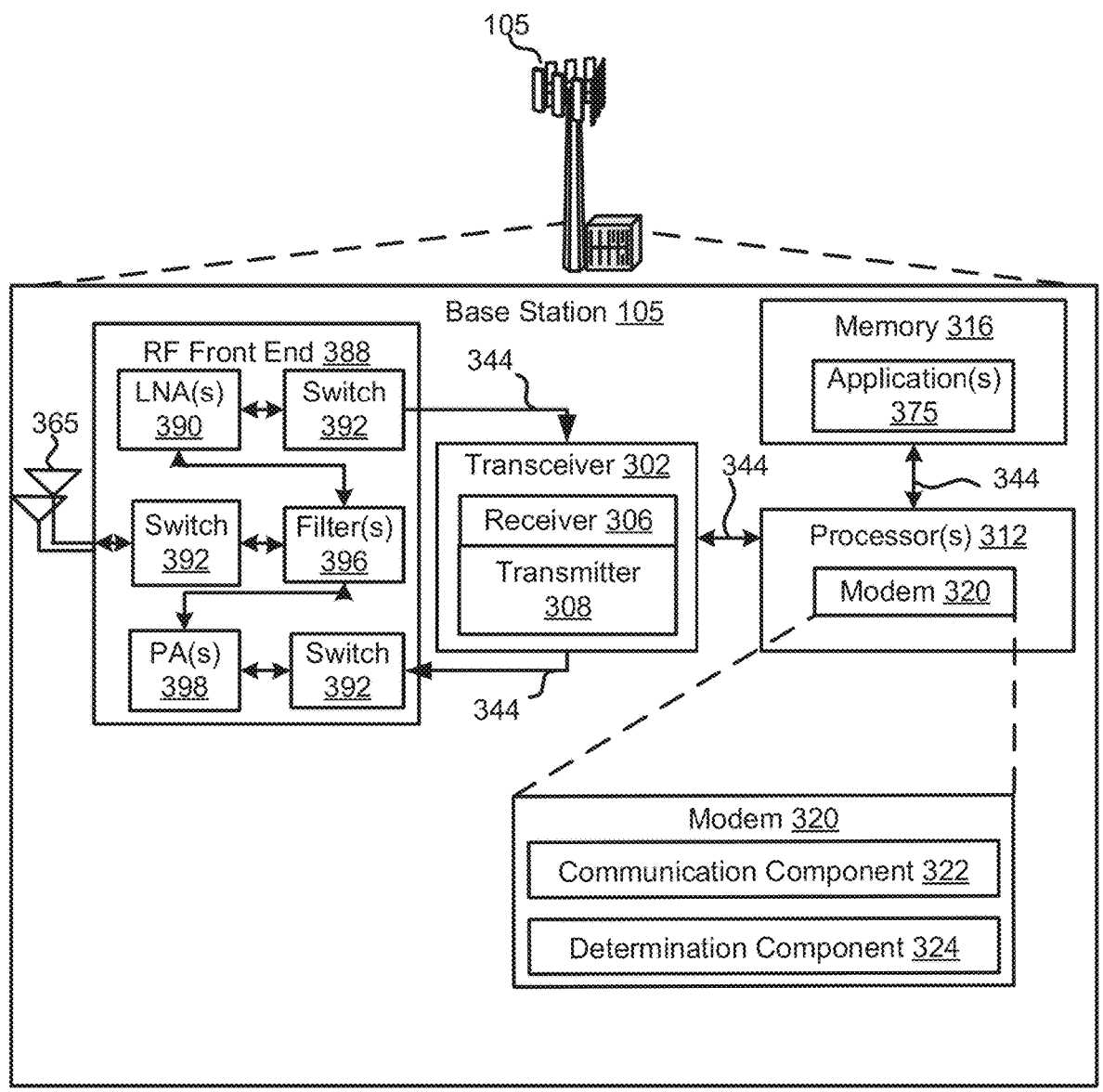
FIG. 3 is a schematic diagram of an example of a base station.

Referring to FIG. 3, one example of an implementation of the BS 105 may include a modem 320 with a communication component 322 configured to transmit data. The communication component 322 and/or the modem 320 the BS 105 may be configured to communicate with the UE 110 via a cellular network, a Wi-Fi network, or other wireless and wired networks.

In some implementations, the BS 105 may include a variety of components, including components such as one or more processors 312 and memory 316 and transceiver 302 in communication via one or more buses 344, which may operate in conjunction with the modem 320 and the communication component 322 to enable one or more of the functions described herein related to communicating with the UE 110. Further, the one or more processors 312, modem 320, memory 316, transceiver 302, RF front end 388 and one or more antennas 365, may be configured to support voice and/or data calls (simultaneously or non-simultaneously) in one or more radio access technologies.

In an aspect, the one or more processors 312 may include the modem 320 that uses one or more modem processors. The various functions related to the communication component 322 and/or the determination component 324 may be included in the modem 320 and/or processors 312 and, in an aspect, may be executed by a single processor, while in other aspects, different ones of the functions may be executed by a combination of two or more different processors. For example, in an aspect, the one or more processors 312 may include any one or any combination of a modem processor, or a baseband processor, or a digital signal processor, or a transmit processor, or a receiving device processor, or a transceiver processor associated with transceiver 302. Additionally, the modem 320 may configure the BS 105 and processors 312. In other aspects, some of the features of the one or more processors 312 and/or the modem 320 associated with the communication component 322 and/or the determination component 324 may be performed by transceiver 302.

Also, memory 316 may be configured to store data used herein and/or local versions of applications 375 or the communication component 322, the determination component, and/or one or more subcomponents of the communication component 322 or the determination component being executed by at least one processor 312. Memory 316 may include any type of computer-readable medium usable by a computer or at least one processor 312, such as random access memory (RAM), read only memory (ROM), tapes, magnetic discs, optical discs, volatile memory, non-volatile memory, and any combination thereof. In an aspect, for example, memory 316 may be a non-transitory computer-readable storage medium that stores one or more computer-executable codes defining the communication component 322, the determination component, and/or one or more of its subcomponents, and/or data associated therewith, when the BS 105 is operating at least one processor 312 to execute the communication component 322, the determination component, and/or one or more of the subcomponents.

Transceiver 302 may include at least one receiver 306 and at least one transmitter 308. The at least one receiver 306 may include hardware, firmware, and/or software code executable by a processor for receiving data, the code comprising instructions and being stored in a memory (e.g., computer-readable medium). The receiver 306 may be, for example, a RF receiving device. In an aspect, receiver 306 may receive signals transmitted by the UE 110. Transmitter 308 may include hardware, firmware, and/or software code executable by a processor for transmitting data, the code comprising instructions and being stored in a memory (e.g., computer-readable medium). A suitable example of transmitter 308 may including, but is not limited to, an RF transmitter.

Moreover, in an aspect, the BS 105 may include RF front end 388, which may operate in communication with one or more antennas 365 and transceiver 302 for receiving and transmitting radio transmissions, for example, wireless communications transmitted by other BS 105 or wireless transmissions transmitted by UE 110. RF front end 388 may be coupled with one or more antennas 365 and may include one or more low-noise amplifiers (LNAs) 390, one or more switches 392, one or more power amplifiers (PAs) 398, and one or more filters 396 for transmitting and receiving RF signals.

In an aspect, LNA 390 may amplify a received signal at a desired output level. In an aspect, each LNA 390 may have a specified minimum and maximum gain values. In an aspect, RF front end 388 may use one or more switches 392 to select a particular LNA 390 and the specified gain value based on a desired gain value for a particular application.

Further, for example, one or more PA(s) 398 may be used by RF front end 388 to amplify a signal for an RF output at a desired output power level. In an aspect, each PA 398 may have specified minimum and maximum gain values. In an aspect, RF front end 388 may use one or more switches 392 to select a particular PA 398 and the specified gain value based on a desired gain value for a particular application.

Also, for example, one or more filters 396 may be used by RF front end 388 to filter a received signal to obtain an input RF signal. Similarly, in an aspect, for example, a respective filter 396 may be used to filter an output from a respective PA 398 to produce an output signal for transmission. In an aspect, each filter 396 may be coupled with a specific LNA 390 and/or PA 398. In an aspect, RF front end 388 may use one or more switches 392 to select a transmit or receive path using a specified filter 396, LNA 390, and/or PA 398, based on a configuration as specified by transceiver 302 and/or processor 312.

As such, transceiver 302 may be configured to transmit and receive wireless signals through one or more antennas 365 via RF front end 388. In an aspect, transceiver may be tuned to operate at specified frequencies such that BS 105 may communicate with, for example, the UE 110 or one or more cells associated with one or more BS 105. In an aspect, for example, the modem 320 may configure transceiver 302 to operate at a specified frequency and power level based on the base station configuration of the BS 105 and the communication protocol used by the modem 320.

In an aspect, the modem 320 may be a multiband-multimode modem, which may process digital data and communicate with transceiver 302 such that the digital data is sent and received using transceiver 302. In an aspect, the modem 320 may be multiband and be configured to support multiple frequency bands for a specific communications protocol. In an aspect, the modem 320 may be multimode and be configured to support multiple operating networks and communications protocols. In an aspect, the modem 320 may control one or more components of the BS 105 (e.g., RF front end 388, transceiver 302) to enable transmission and/or reception of signals from the network based on a specified modem configuration. In an aspect, the modem configuration may be based on the mode of the modem and the frequency band in use. In another aspect, the modem configuration may be based on base station configuration associated with the BS 105.

Figure 4:
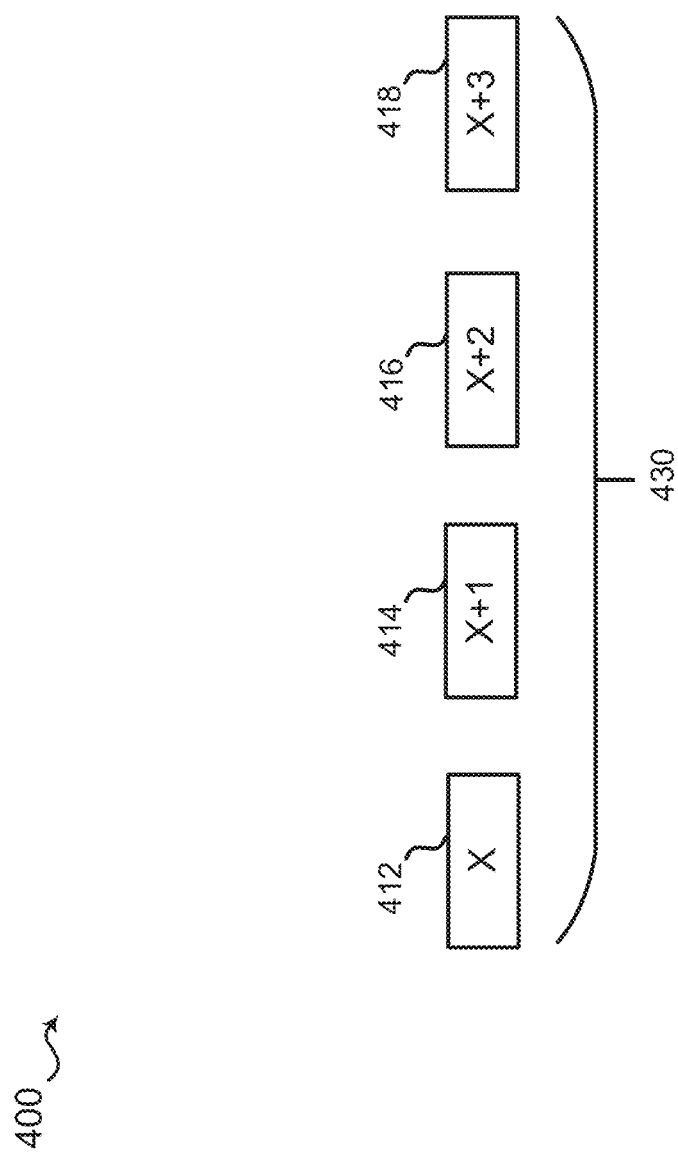
FIG. 4 is schematic diagram of an example of new radio (NR) packet data convergence protocol (PDCP) reception according to aspects of the present disclosure.

Turning to FIG. 4, in an implementation, an example of NR PDCP reception 400 may include a first block 412 having a first SN number X, a second block 414 having a second SN number X+1, a third block 416 having a third SN number X+2, and a fourth block 418 having a fourth SN number X+3. The blocks 412, 414, 416, 418 may be transmitted by one or more transmitting devices (e.g., UE 110 and/or BS 105). The blocks 412, 414, 416, 418 may be received by a receiving device (e.g., UE 110 and/or BS 105) in an order different than the order of the SN numbers X, X+1, X+2, X+3. For example, the receiving device may receive the blocks 412, 414, 416, 418 in the following order: the third block 416, the first block 412, the fourth block 418, and the second block 414.

In one implementation, the transmitting device may reset the compression memory before transmitting the first block 412. The transmitting device may transmit an indication packet indicating that the compression memory has been reset. After the resetting compression memory, the transmitting device may add one or more alphanumeric strings in the first block 412 into the compression memory. If any of the blocks 414, 416, 418 includes the one or more alphanumeric strings, the transmitting device may transmit one or more pointers to the one or more alphanumeric strings in the first block 412 instead of the one or more alphanumeric strings when transmitting the blocks 414, 416, 418 using the LZ77 and/or Huffman encoding described above. The transmitting device may transmit the blocks 412, 414, 416, 418 to the receiving device. In one optional implementation, the transmitting device may transmit the indication that the compression memory has been reset with the blocks 412, 414, 416, 418. The indication may be embedded in the first block 412.

In some implementations, the receiving device may receive the blocks 412, 414, 416, 418 during a first window 430. The first window 430 may be an amount of time the receiving device allots to receive, reorder, and/or decode the data and/or control information in the blocks 412, 414, 416, 418. The first window 430 may be the same or different as the reordering timer $t_{reordering}$.

In some implementations, some information in the blocks 412, 414, 416, 418 may be compressed using the LZ77 and/or Huffman encoding described above. For example, information in at least one of blocks 414, 416, 418 may include one or more pointers to the one or more alphanumeric strings in the first block 412. If the first block 412 is not received (e.g., the receiving device fails to receive and/or decode the first block 412), the receiving device may be unable to properly decompress blocks 414, 416, 418.

In some instances, the receiving device may determine that the reordering timer $t_{reordering}$ has expired. If the receiving device has not properly received and/or decoded the first block 412 prior to the expiration, the receiving device may be unable to properly decompress and/or decode blocks 414, 416, 418. In some implementations, the receiving device may transmit a memory reset request to the transmitting device once the reordering timer $t_{reordering}$ has expired.

Figure 5:
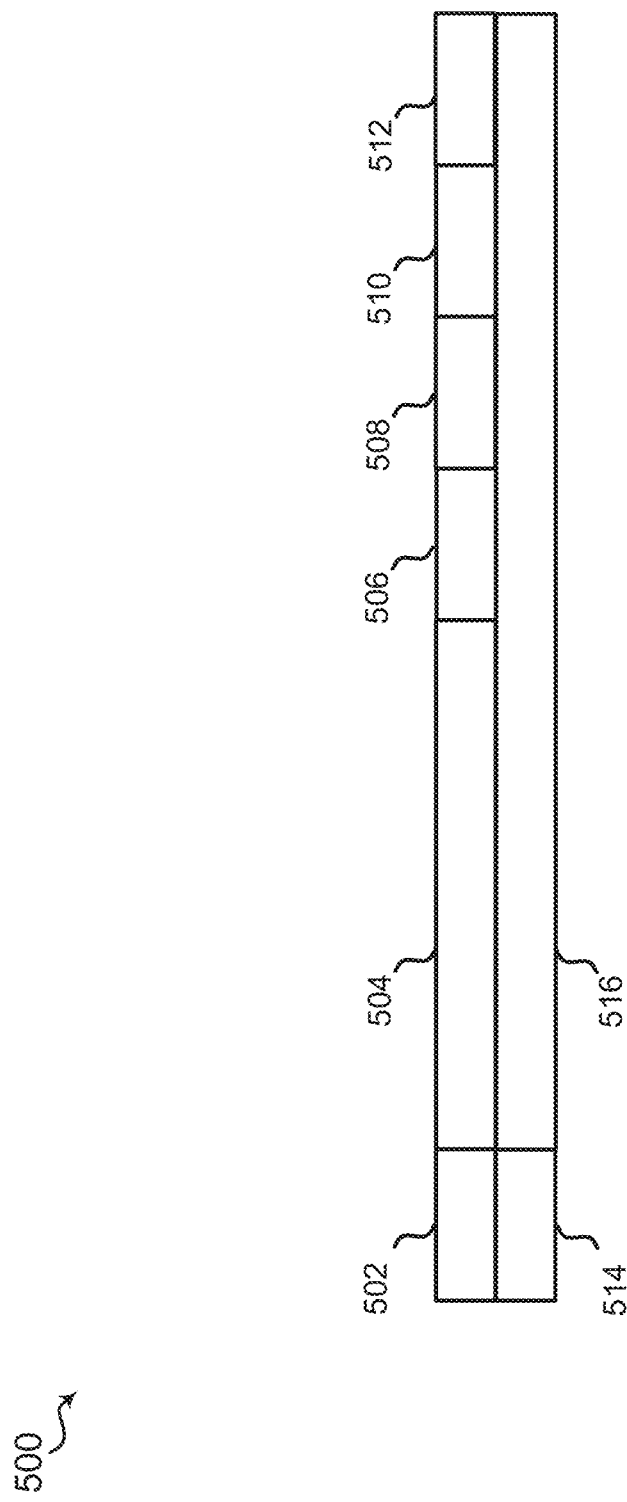
FIG. 5 is a schematic diagram of an example of a feedback packet according to aspects of the present disclosure.

Turning to FIG. 5, in one aspect of the present disclosure, an example of a feedback packet 500 may be used by a receiving device to provide data compression feedback. The packet 500 may include a data/control bit field 502 that indicates whether the packet 500 is associated with data information or control information. The packet 500 may include a protocol data unit (PDU) type field 504. The PDU type field 504 may include three bits to indicate one of a PDCP status report, an interspersed robust header compression (ROHC) feedback packet, a Long-Term Evolution Wireless Local Area Network Aggregation (LWA) status report, a LWA end-marker packet, an uplink data compression (UDC) feedback packet, a downlink data compression feedback packet, or reserved bits. The feedback packet 500 may include a FE field 506 that indicates whether a checksum error is detected. For example, a value of "1" may indicate that a checksum error is detected (i.e., the receiving device is unable to decompress and/or decode a compressed packet transmitted by the transmitting device) and the transmitting device should reset the compression memory. A value of "0" may indicate no checksum error (i.e., the receiving device is able to decompress and/or decode the compressed packet transmitted by the transmitting device). In one instance, the checksum error may occur when the compression memory of the transmitting device and the decompression memory of the receiving device are not synchronized. The checksum error may occur when one or more PDUs is corrupted and/or out-of-sync, or if one or more PDUs is lost during transmission.

In certain implementations, the feedback packet 500 may include a first reserved bit 508, a second reserved bit 510, a third reserved bit 512, and a fourth reserved bit 514. The reserved bits 508, 510, 512, 514 may be reserved to signal information not indicated in the feedback packet 500.

In one aspect of the present disclosure, the feedback packet 500 may include a recent SN field 516. The recent SN field 516 may include one or more SNs of one or more packets processed by the receiving device. In one implementation, the recent SN field 516 may include one or more SNs of most recent packets processed by the receiving device. The most recent packets may be compressed or non-compressed. The receiving device may utilize other examples of the feedback packet 500 to transmit the information associated with the recent SN field 516 to the transmitting device.

In some implementations, the feedback packet 500 may optionally include a PDCP bearer ID. In another implementation, the feedback packet 500 may be implemented as one of a packet data convergence protocol (PDCP) control protocol data unit (PDU), a radio link control PDU, signaling radio bearer (SRB) in radio resource control (RRC), or a medium access control (MAC) control element (CE). In certain implementations, the feedback packet 500 may be transmitted without any buffer threshold restrictions.

Figure 6:
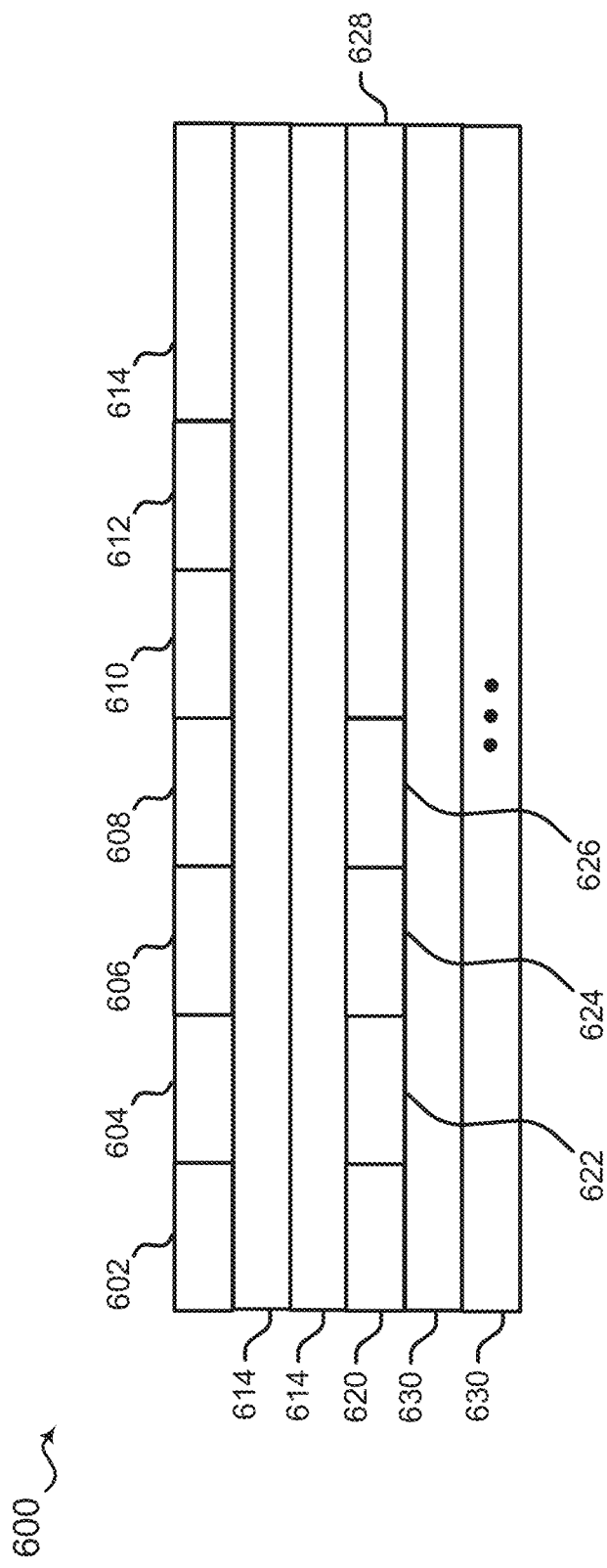
FIG. 6 is schematic diagram of an example of a packet data unit (PDU) according to aspects of the present disclosure.

Turning to FIG. 6, in some implementations, an example of a PDU 600 may include a data/control bit field 602 that indicates whether the PDU 600 is associated with data information or control information. The PDU 600 may include a polling indicator 604 indicating whether the receiving device (e.g., UE 110 or BS 105) is requested to send a PDCP status report or a LWA status report for LWA. The PDU 600 may include reserved fields 606, 608, 610, 612, 624, 626 that may include one or more reserved bits. The PDU 600 may include a SN field 614 that includes the PDCP SN associated with the data/control information carried by the PDU 600. The PDU 600 may include a FU field 620 indicating whether the data/control information carried by the PDU 600 is compressed by UDC protocol. The PDU 600 may include a FR field 622 indicating whether the UDC compression memory of the transmitting device is reset or not. For example, a value of "1" means the PDU 600 is the first compressed packet after UDC compression memory reset. The PDU 600 may include a checksum field 628 that includes a checksum value associated with the data/control information carried by the PDU 600. The PDU 600 may include one or more information block 630 for carrying data/control information.

Figure 7:
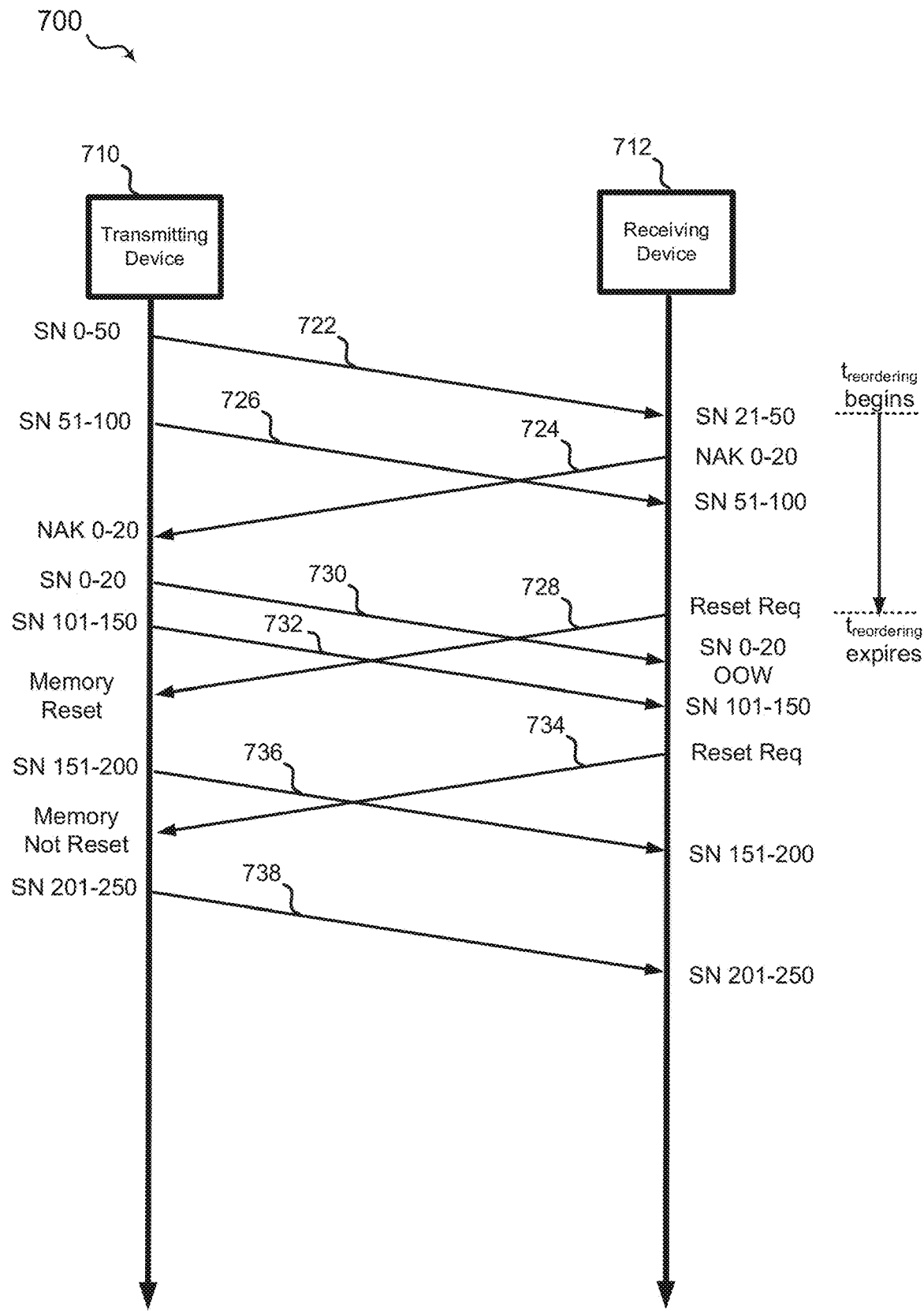
FIG. 7 is a first example of a flowchart according to aspects of the present disclosure.

Turning to FIG. 7, in some aspects of the present disclosure, a first example of a flowchart 700 may include a transmitting device 710 (e.g., the UE 110 or the BS 105) and a receiving device 712 (e.g., the BS 105 or the UE 110). The flowchart 700 may illustrate an implementation including the transmitting device 710 refraining from performing a memory reset. At 722, the transmitting device 710 may transmit compressed packets having sequence numbers 0-50 (denoted as packets[SN 0-50]) to the receiving device 712. The receiving device 712 may be able to receive the packets [SN 21-50] without the packets[SN 0-20] because the packets[SN 0-20] are lost (e.g., not properly received, corrupted, etc.). However, the receiving device 712 may be unable to decompress and/or decode at least a portion of the packets [SN 21-50] because the packets[SN 21-50] include pointers (based on LZ77 and/or Huffman coding as described above) to the packets[SN 0-20]. The inability to decompress and/or decode may be due to a checksum failure. As a result, the receiving device 712 may begin the $t_{reordering}$ timer to await for the retransmission of the packets[SN 0-20]. At 724, the receiving device 712 may transmit a negative acknowledgement (NAK) for the packets[SN 0-20] to the transmitting device 710 indicating the failure to receive the packets[SN 0-20]. At 726, the transmitting device 710 may transmit the packets[SN 51-100] to the receiving device 712. The data information in the packets[SN 0-50] and the data information in the packets[SN 51-100] may be the same or different. Due to the failed reception of the packets[SN 0-20], the receiving device 712 may determine a checksum failure for the packets[SN 51-100].

At 728, the $t_{reordering}$ timer may expire. As a result, the receiving device 712 may transmit a memory reset request to the transmitting device 710 to reset the compression memory of the transmitting device 710. The memory reset request may include a recent SN (e.g., one of SN 51-100) associated with the checksum failure of the packets[SN 51-100]. The latest processed sequence number may be SN 100. In a particular implementation, the memory reset request may include the last SN (e.g., SN 100) associated with the checksum failure of the packets[SN 51-100]. In one example, the receiving device 712 may transmit the feedback packet 500 (FIG. 5) and may set the value of the FE field 506 to "1" to indicate the checksum failure. The feedback packet 500 (FIG. 5) may include one of SN 51-100 in the recent SN field 516.

At 730, prior to receiving the memory reset request transmitted by the receiving device 712 at 728, the transmitting device 710 may retransmit the packets[SN 0-20] in response to the received NAK for the packets[SN 0-20].

However, the retransmitted packets[SN 0-20] may arrive at the receiving device 712 after the expiration of the $t_{reordering}$ timer, and the retransmitted packets[SN 0-20] may be discarded by the receiving device 712 due to being out of window (OOW).

At 732, prior to receiving the memory reset request transmitted by the receiving device 712 at 728, the transmitting device 710 may transmit the packets[SN 101-150] to the receiving device 712. Due to the failure to receive the packets[SN 0-20] (original transmission and subsequent retransmission(s)) before the expiration of the $t_{reordering}$ timer, the receiving device 712 may determine a checksum failure for the packets[SN 101-150].

In an aspect of the current disclosure, after the transmission of the packets[SN 101-150] at 732, the transmitting device 710 may receive the memory reset request transmitted by the receiving device 712 at 728. The transmitting device 710 may compare the recent SN (i.e., one of SN 51-100) embedded in the memory reset request with a reset SN associated with data transmitted immediately after the previous memory reset (e.g., last reset sequence number, such as SN 0). The data transmitted immediately after the previous memory reset may be the first packet (i.e., the packet[SN 0]), the first group of packets (i.e., the packets [SN 0-20]), or the first data unit (i.e., the packets[SN 0-50]) transmitted after the previous memory reset without intermittent transmission. The transmitting device 710 may determine that the recent SN is greater than or equal to the reset SN (SN 100≥SN 0), and consequently, may perform the compression memory reset. The compression memory reset may clear the code for compression (e.g., Huffman coding tree) from the memory buffer. After the compression memory reset, the transmitting device 710 may generate a new code for compression based on the packets to be transmitted to the receiving device 712.

At 734, in response to the checksum failure for the packets[SN 101-150], the receiving device 712 may transmit a memory reset request (after another $t_{reordering}$ timer has expired, not shown) to the transmitting device 710 to reset the compression memory of the transmitting device 710. The memory reset request may include a recent SN (e.g., one of SN 101-150) associated with the checksum failure of the packets[SN 101-150]. The latest processed sequence number may be SN 150. In a particular implementation, the memory reset request may include the last SN (e.g., SN 150) associated with the checksum failure of the packets[SN 101-150]. In one example, the receiving device 712 may transmit the feedback packet 500 (FIG. 5) and may set the value of the FE field 506 to "1" to indicate the checksum failure. The feedback packet 500 (FIG. 5) may include one of SN 101-150 in the recent SN field 516.

At 736, prior to receiving the memory reset request transmitted by the receiving device 712 at 734 and after performing the memory reset request associated with the memory reset request transmitted by the receiving device 712 at 728, the transmitting device 710 may transmit the packets[SN 151-200] to the receiving device 712. In one example, the transmitting device 710 may transmit the packet[SN 151-200] via the PDU 600 (FIG. 6). The packets [SN 151-200] and/or information in the packets[SN 151-200] may be embedded in the one or more information block 630 of the PDU 600. The SN field 614 of the PDU 600 may include the SN 201-250. The FR field 622 may indicate that the compression memory has been reset. The checksum field 628 may include a checksum value for the packets[SN 151-200].

Due to the compression memory reset requested by the receiving device 712 at 728, after receiving the packets[SN 151-200], the receiving device 712 may be able to decompress and/or decode the packets[SN 151-200] and determine a checksum success. In one implementation, the receiving device 712 may be able to decompress and/or decode the packets[SN 151-200] because pointers in the packets[SN 151-200] do not point to the packets[SN 0-20] due to the memory reset requested by the receiving device 712 at 728.

In certain aspects of the present disclosure, after transmitting the packets[SN 151-200] at 736, the transmitting device 710 may receive the memory reset request transmitted by the receiving device 712 at 734. The transmitting device 710 may compare the recent SN (i.e., one of SN 101-150) embedded in the memory reset request with a reset SN associated with data transmitted immediately after the previous memory reset. The data transmitted immediately after the previous memory reset may be the first packet (i.e., the packet[SN 151]), the first group of packets (i.e., the packets[SN 151-160]), or the first data unit (i.e., the packets [SN 151-200]) transmitted after the previous memory reset without intermittent transmission. The transmitting device 710 may determine that the recent SN is less than the reset SN (SN 150<SN 151), and consequently, may not perform the memory reset. The transmitting device 710 may determine, based on the recent SN value and the status of the memory reset, that the memory reset request transmitted by the receiving device 712 at 734 occurs in response to data transmitted prior to the previous memory request (memory request due to the request at 728). Therefore, the receiving device 712 will be able to decompress and/or decode data after the previous memory reset.

At 738, the transmitting device 710 may transmit the packets[SN 201-250] to the receiving device 712. Due to the compression memory reset requested by the receiving device 712 at 728, after receiving the packets[SN 201-250], the receiving device 712 may be able to decompress and/or decode the packets[SN 201-250] and determine a checksum success. In one implementation, the receiving device 712 may be able to decompress and/or decode the packets[SN 201-250] because pointers in the packets[SN 151-200] do not point to the packets[SN 0-20] due to the memory reset requested by the receiving device 712 at 728.

Figure 8:
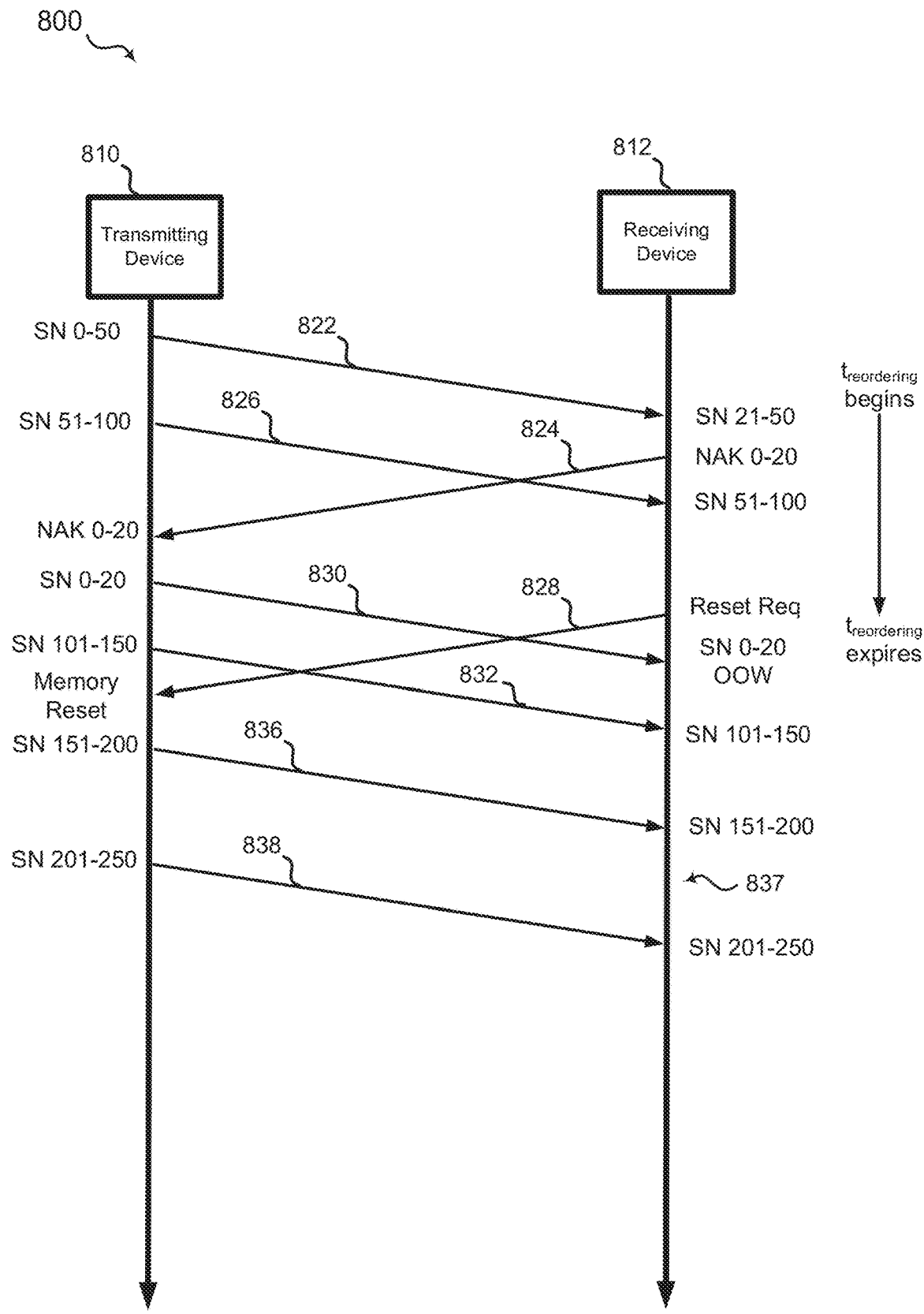
FIG. 8 is a second example of a flowchart according to aspects of the present disclosure.

Turning to FIG. 8, in some aspects of the present disclosure, a second example of a flowchart 800 may include a transmitting device 810 (e.g., the UE 110 or the BS 105) and a receiving device 812 (e.g., the BS 105 or the UE 110). The flowchart 800 may illustrate an implementation including the receiving device 812 cancelling a memory reset request. At 822, the transmitting device 810 may transmit compressed packets having sequence numbers 0-50 (denoted as packets[SN 0-50]) to the receiving device 812. The receiving device 812 may be able to receive the packets[SN 21-50] but not the packets[SN 0-20] because the packets[SN 0-20] are lost. However, the receiving device 812 may be unable to decompress and/or decode at least a portion of the packets[SN 21-50] because the packets[SN 21-50] include pointers (based on LZ77 and/or Huffman coding as described above) to the packets[SN 0-20], which were not received. The inability to decompress and/or decode may be due to a checksum failure. As a result, the receiving device 812 may begin the $t_{reordering}$ timer to await for the retransmission of the packets[SN 0-20]. At 824, the receiving device 812 may transmit a negative acknowledgement (NAK) for the packets[SN 0-20] to the transmitting device 810 indicating the failure to receive the packets[SN 0-20]. At 826, the transmitting device 810 may transmit the packets

[SN 51-100] to the receiving device 812. Due to the failed reception of the packets[SN 0-20], the receiving device 812 may determine a checksum failure for the packets[SN 51-100].

At 828, the $t_{reordering}$ timer may expire. As a result, the receiving device 812 may transmit a memory reset request to the transmitting device 810 to reset the compression memory of the transmitting device 810. The memory reset request may include a recent SN (e.g., one of SN 51-100) associated with the checksum failure of the packets[SN 51-100]. In a particular implementation, the memory reset request may include the last SN (e.g., SN 100) associated with the checksum failure of the packets[SN 51-100]. In one example, the receiving device 812 may transmit the feedback packet 500 (FIG. 5) and may set the value of the FE field 506 to "1" to indicate the checksum failure. The feedback packet 500 (FIG. 5) may include one of SN 51-100 in the recent SN field 516.

At 830, prior to receiving the memory reset request transmitted by the receiving device 812 at 828, the transmitting device 810 may retransmit the packets[SN 0-20] in response to the received NAK for the packets[SN 0-20]. However, the retransmitted packets[SN 0-20] may arrive at the receiving device 812 after the expiration of the $t_{reordering}$ timer, and the retransmitted packets[SN 0-20] may be discarded by the receiving device 812 due to being out of window (OOW).

At 832, prior to receiving the memory reset request transmitted by the receiving device 812 at 828, the transmitting device 810 may transmit the packets[SN 101-150] to the receiving device 812. Due to the failure to receive the packets[SN 0-20] (original transmission and subsequent retransmission(s)) before the expiration of the $t_{reordering}$ timer, the receiving device 812 may determine a checksum failure for the packets[SN 101-150].

In an aspect of the current disclosure, after the transmission of the packets[SN 101-150] at 832, the transmitting device 810 may receive the memory reset request transmitted by the receiving device 812 at 828. The transmitting device 810 may compare the recent SN (i.e., one of SN 51-100) embedded in the memory reset request with a reset SN associated with data transmitted immediately after the previous memory reset. The data transmitted immediately after the previous memory reset may be the first packet (i.e., the packet[SN 0]), the first group of packets (i.e., the packets[SN 0-20]), or the first data unit (i.e., the packets[SN 0-50]) transmitted after the previous memory reset without intermittent transmission. The transmitting device 810 may determine that the recent SN is greater than or equal to the reset SN (SN 100≥SN 0), and consequently, may perform the compression memory reset.

At 836, the transmitting device 810 may transmit the packets[SN 151-200] to the receiving device 812. In one example, the transmitting device 810 may transmit the packet[SN 151-200] via the PDU 600 (FIG. 6). The packets [SN 151-200] and/or information in the packets[SN 151-200] may be embedded in the one or more information block 630 of the PDU 600. The SN field 614 of the PDU 600 may include the SN 201-250. The FR field 622 may indicate that the compression memory has been reset. The checksum field 628 may include a checksum value for the packets[SN 151-200].

Due to the compression memory reset requested by the receiving device 812 at 828, after receiving the packets[SN 151-200], the receiving device 812 may be able to decompress and/or decode the packets[SN 151-200] and determine a checksum success. In one implementation, the receiving device 812 may be able to decompress and/or decode the packets[SN 151-200] because pointers in the packets[SN 151-200] do not point to the packets[SN 0-20] due to the memory reset requested by the receiving device 812 at 828.

In some aspects of the present disclosure, at 837, the receiving device 812 may determine whether to withhold a memory request due to the checksum failure for the packets [SN 101-150], in response to the checksum failure for the packets[SN 101-150]. The receiving device 812 may determine if a failure SN (e.g., SN 150) associated with the packets[SN 101-150] failing the check sum is smaller than a current SN of the data unit associated with data transmitted by a transmitting device immediately after the a memory reset. The data transmitted immediately after the previous memory reset may be the first packet (i.e., the packet[SN 151]), the first group of packets (i.e., the packets[SN 151-180]), or the first data unit (i.e., the packets[SN 151-200]) transmitted after the previous memory reset without intermittent transmission. If the receiving device 812 determines that the failure SN is smaller than the current SN, then the receiving device 812 may withhold the memory request.

At 838, the transmitting device 810 may transmit the packets[SN 201-250] to the receiving device 812. Due to the compression memory reset requested by the receiving device 812 at 828, after receiving the packets[SN 201-250], the receiving device 812 may be able to decompress and/or decode the packets[SN 201-250] and determine a checksum success. In one implementation, the receiving device 812 may be able to decompress and/or decode the packets[SN 201-250] because pointers in the packets[SN 151-200] do not point to the packets[SN 0-20] due to the memory reset requested by the receiving device 812 at 828.

Figure 9:
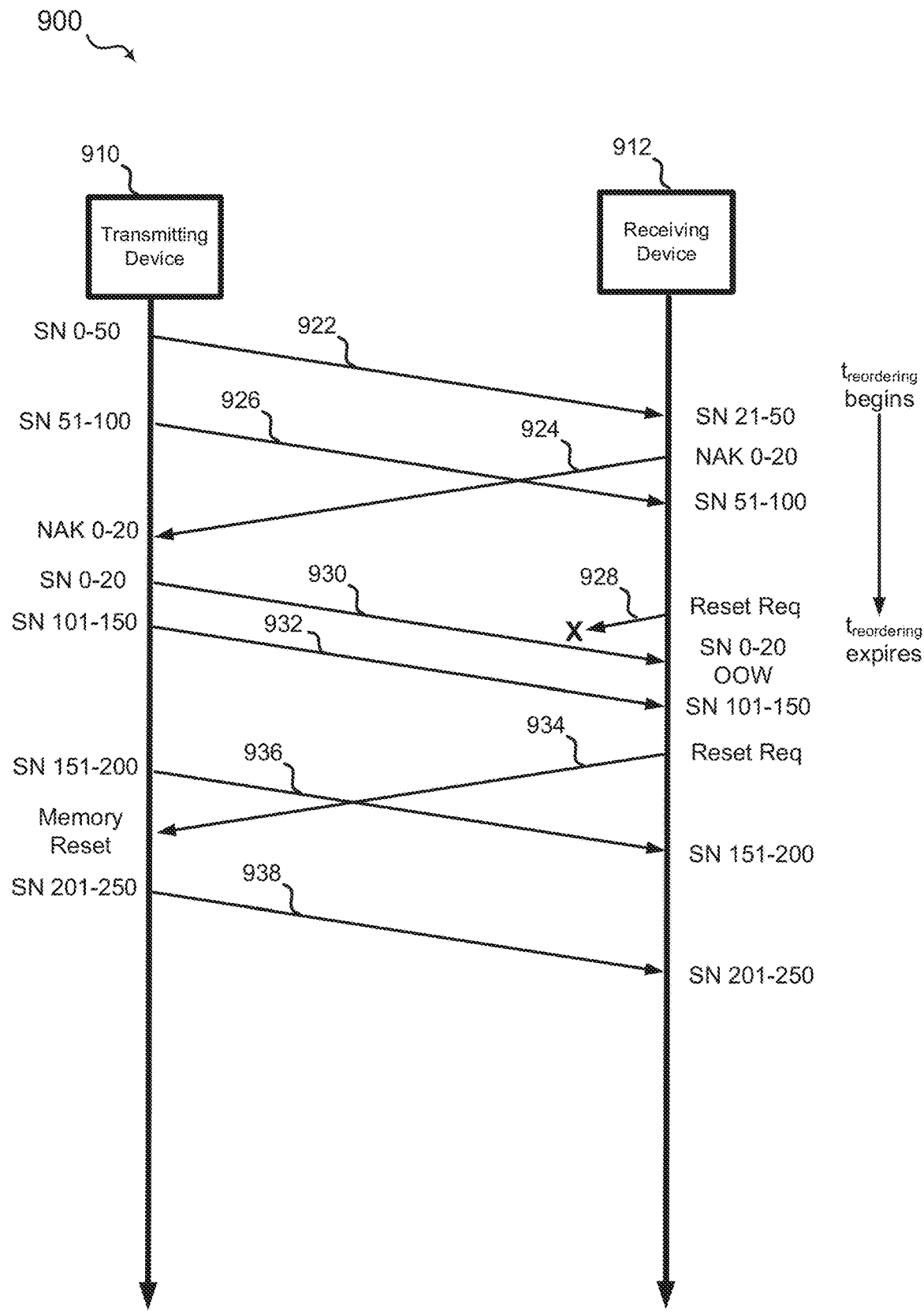
FIG. 9 is a third example of a flowchart according to aspects of the present disclosure.

Turning to FIG. 9, in some aspects of the present disclosure, a third example of a flowchart 900 may include a transmitting device 910 (e.g., the UE 110 or the BS 105) and a receiving device 912 (e.g., the BS 105 or the UE 110). The flowchart 900 may illustrate an implementation for the transmitting device 910 to perform memory reset when a memory reset request is lost during transmission. At 922, the transmitting device 910 may transmit compressed packets having sequence numbers 0-50 (denoted as packets[SN 0-50]) to the receiving device 912. The receiving device 912 may be able to receive the packets[SN 21-50] because the packets[SN 0-20] are lost. However, the receiving device 912 may be unable to decompress and/or decode at least a portion of the packets[SN 21-50] because the packets[SN 21-50] include pointers (based on LZ77 and/or Huffman coding as described above) to the packets[SN 0-20]. The inability to decompress and/or decode may be due to a checksum failure. As a result, the receiving device 912 may begin the $t_{reordering}$ timer to await for the retransmission of the packets[SN 0-20]. At 924, the receiving device 912 may transmit a negative acknowledgement (NAK) for the packets [SN 0-20] to the transmitting device 910 indicating the failure to receive the packets[SN 0-20]. At 926, the transmitting device 910 may transmit the packets[SN 51-100] to the receiving device 912. Due to the failed reception of the packets[SN 0-20], the receiving device 912 may determine a checksum failure for the packets[SN 51-100].

At 928, the $t_{reordering}$ timer may expire. As a result, the receiving device 912 may transmit a memory reset request to the transmitting device 910 to reset the compression memory of the transmitting device 910. The memory reset request may include a recent SN (e.g., one of SN 51-100) associated with the checksum failure of the packets[SN 51-100]. In a particular implementation, the memory reset request may include the last SN (e.g., SN 100) associated with the checksum failure of the packets[SN 51-100]. In one example, the receiving device 912 may transmit the feedback packet 500 (FIG. 5) and may set the value of the FE field 506 to "1" to indicate the checksum failure. The feedback packet 500 (FIG. 5) may include one of SN 51-100 in the recent SN field 516. In some instances, the memory reset request may be lost during transmission.

At 930, prior to receiving the memory reset request transmitted by the receiving device 912 at 928, the transmitting device 910 may retransmit the packets[SN 0-20] in response to the received NAK for the packets[SN 0-20]. However, the retransmitted packets[SN 0-20] may arrive at the receiving device 912 after the expiration of the $t_{reordering}$ timer, and the retransmitted packets[SN 0-20] may be discarded by the receiving device 912 due to being out of window (OOW).

At 932, prior to receiving the memory reset request transmitted by the receiving device 912 at 928, the transmitting device 910 may transmit the packets[SN 101-150] to the receiving device 912. Due to the failure to receive the packets[SN 0-20] (original transmission and subsequent retransmission(s)) before the expiration of the $t_{reordering}$ timer, the receiving device 912 may determine a checksum failure for the packets[SN 101-150].

At 934, in response to the checksum failure for the packets[SN 101-150], the receiving device 912 may transmit a memory reset request (after another $t_{reordering}$ timer has expired, not shown) to the transmitting device 910 to reset the compression memory of the transmitting device 910. The memory reset request may include a recent SN (e.g., one of SN 101-150) associated with the checksum failure of the packets[SN 101-150]. In a particular implementation, the memory reset request may include the last SN (e.g., SN 150) associated with the checksum failure of the packets[SN 101-150]. In one example, the receiving device 912 may transmit the feedback packet 500 (FIG. 5) and may set the value of the FE field 506 to "1" to indicate the checksum failure. The feedback packet 500 (FIG. 5) may include one of SN 101-150 in the recent SN field 516.

At 936, prior to receiving the memory reset request transmitted by the receiving device 912 at 934, the transmitting device 910 may transmit the packets[SN 151-200] to the receiving device 912. Due to the lost memory reset request (transmitted by the receiving device 912 at 928), after receiving the packets[SN 151-200], the receiving device 912 may be unable to decompress and/or decode the packets[SN 151-200] and determine a checksum failure. In one implementation, the receiving device 912 may be unable to decompress and/or decode the packets[SN 151-200] because of the lost memory reset request transmitted by the receiving device 912 at 928.

In certain aspects of the present disclosure, after transmitting the packets[SN 151-200] at 936, the transmitting device 910 may receive the memory reset request transmitted by the receiving device 912 at 934. The transmitting device 910 may compare the recent SN (i.e., one of SN 101-150) embedded in the memory reset request with a reset SN associated with data transmitted immediately after the previous memory reset. The data transmitted immediately after the previous memory reset may be the first packet (i.e., the packet[SN 0]), the first group of packets (i.e., the packets[SN 0-20]), or the first data unit (i.e., the packets[SN 0-50]) transmitted after the previous memory reset without intermittent transmission. The transmitting device 910 may determine that the recent SN is greater than the reset SN (e.g., SN 150>SN 0), and consequently, may perform the memory reset.

At 938, the transmitting device 910 may transmit the packets[SN 201-250] to the receiving device 912. In one example, the transmitting device 910 may transmit the packet[SN 201-250] via the PDU 600 (FIG. 6). The packets [SN 201-250] and/or information in the packets[SN 201-250] may be embedded in the one or more information block 630 of the PDU 600. The SN field 614 of the PDU 600 may include the SN 201-250. The FR field 622 may indicate that the compression memory has been reset. The checksum field 628 may include a checksum value for the packets[SN 201-250].

Due to the compression memory reset requested by the receiving device 912 at 934, after receiving the packets[SN 201-250], the receiving device 912 may be able to decompress and/or decode the packets[SN 201-250] and determine a checksum success. In one implementation, the receiving device 912 may be able to decompress and/or decode the packets[SN 201-250] because pointers in the packets[SN 151-200] do not point to the packets[SN 0-20] due to the memory reset requested by the receiving device 912 at 934.

Figure 10:
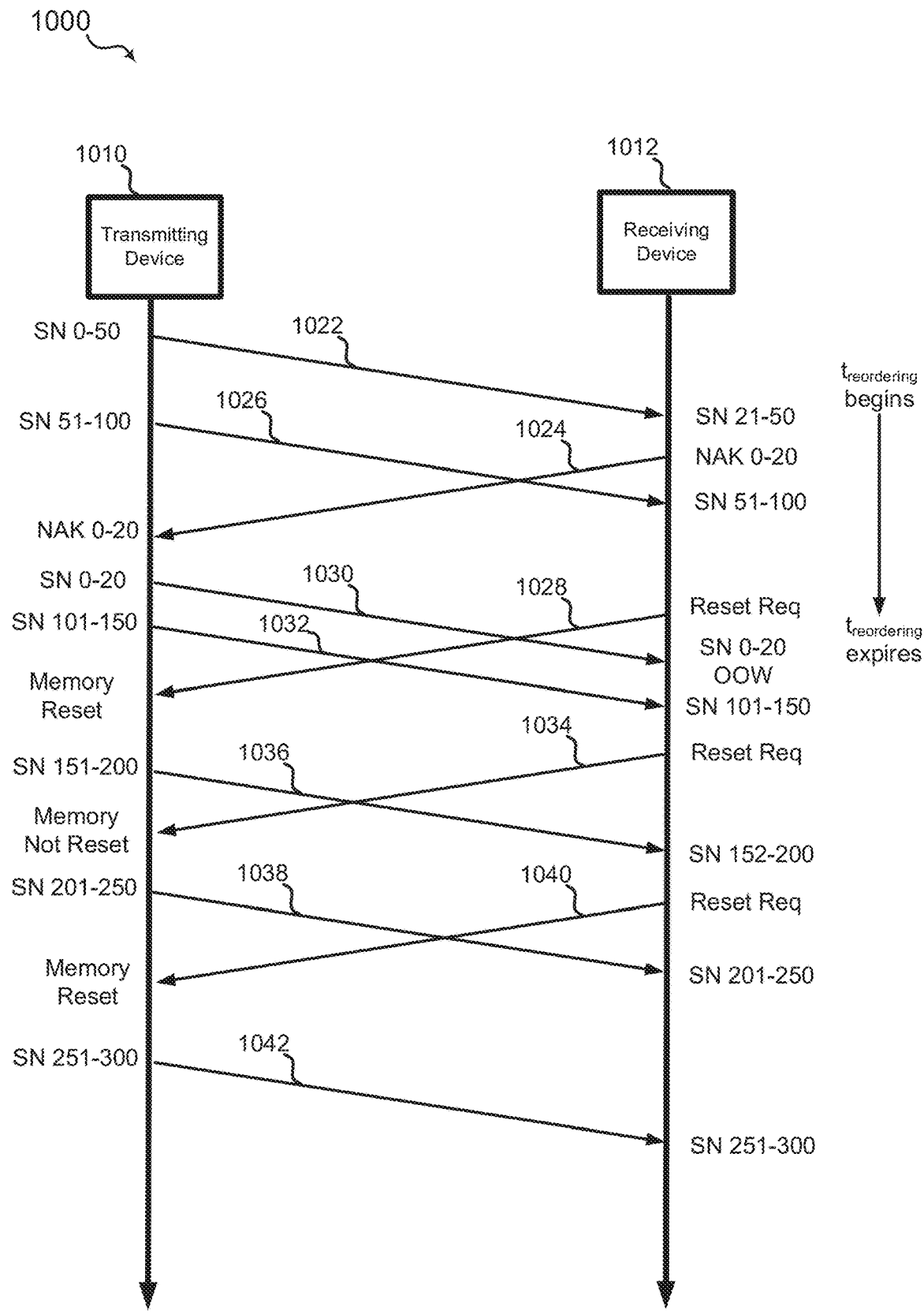
FIG. 10 is a fourth example of a flowchart according to aspects of the present disclosure.

Turning to FIG. 10, in some aspects of the present disclosure, a fourth example of a flowchart 1000 may include a transmitting device 1010 (e.g., the UE 110 or the BS 105) and a receiving device 1012 (e.g., the BS 105 or the UE 110). At 1022, the transmitting device 1010 may transmit compressed packets having sequence numbers 0-50 (denoted as packets[SN 0-50]) to the receiving device 1012. The receiving device 1012 may be able to receive the packets[SN 21-50] because the packets[SN 0-20] are lost. However, the receiving device 1012 may be unable to decompress and/or decode at least a portion of the packets [SN 21-50] because the packets[SN 21-50] include pointers (based on LZ77 and/or Huffman coding as described above) to the packets[SN 0-20]. The inability to decompress and/or decode may be due to a checksum failure. As a result, the receiving device 1012 may begin the $t_{reordering}$ timer to await for the retransmission of the packets[SN 0-20]. At 1024, the receiving device 1012 may transmit a negative acknowledgement (NAK) for the packets[SN 0-20] to the transmitting device 1010 indicating the failure to receive the packets [SN 0-20]. At 1026, the transmitting device 1010 may transmit the packets[SN 51-100] to the receiving device 1012. Due to the failed reception of the packets[SN 0-20], the receiving device 1012 may determine a checksum failure for the packets[SN 51-100].

At 1028, the $t_{reordering}$ timer may expire. As a result, the receiving device 1012 may transmit a memory reset request to the transmitting device 1010 to reset the compression memory of the transmitting device 1010. The memory reset request may include a recent SN (e.g., one of SN 51-100) associated with the checksum failure of the packets[SN 51-100]. In a particular implementation, the memory reset request may include the last SN (e.g., SN 100) associated with the checksum failure of the packets[SN 51-100]. In one example, the receiving device 1012 may transmit the feedback packet 500 (FIG. 5) and may set the value of the FE field 506 to "1" to indicate the checksum failure. The feedback packet 500 (FIG. 5) may include one of SN 51-100 in the recent SN field 516.

At 1030, prior to receiving the memory reset request transmitted by the receiving device 1012 at 1028, the transmitting device 1010 may retransmit the packets[SN 0-20] in response to the received NAK for the packets[SN 0-20]. However, the retransmitted packets[SN 0-20] may arrive at the receiving device 1012 after the expiration of the $t_{reordering}$ timer, and the retransmitted packets[SN 0-20] may be discarded by the receiving device 1012 due to being out of window (OOW).

At 1032, prior to receiving the memory reset request transmitted by the receiving device 1012 at 1028, the transmitting device 1010 may transmit the packets[SN 101-150] to the receiving device 1012. Due to the failure to receive the packets[SN 0-20] (original transmission and subsequent retransmission(s)) before the expiration of the $t_{reordering}$ timer, the receiving device 1012 may determine a checksum failure for the packets[SN 101-150].

In an aspect of the current disclosure, after the transmission of the packets[SN 101-150] at 1032, the transmitting device 1010 may receive the memory reset request transmitted by the receiving device 1012 at 1028. The transmitting device 1010 may compare the recent SN (i.e., one of SN 51-100) embedded in the memory reset request with a reset SN associated with data transmitted immediately after the previous memory reset. The data transmitted immediately after the previous memory reset may be the first packet (i.e., the packet[SN 0]), the first group of packets (i.e., the packets[SN 0-20]), or the first data unit (i.e., the packets[SN 0-50]) transmitted after the previous memory reset without intermittent transmission. The transmitting device 1010 may determine that the recent SN is greater than the reset SN (SN 100>SN 0), and consequently, may perform the compression memory reset.

At 1034, in response to the checksum failure for the packets[SN 101-150], the receiving device 1012 may transmit a memory reset request (after another $t_{reordering}$ timer has expired, not shown) to the transmitting device 1010 to reset the compression memory of the transmitting device 1010. The memory reset request may include a recent SN (e.g., one of SN 101-150) associated with the checksum failure of the packets[SN 101-150]. In a particular implementation, the memory reset request may include the last SN (e.g., SN 150) associated with the checksum failure of the packets[SN 101-150]. In one example, the receiving device 1012 may transmit the feedback packet 500 (FIG. 5) and may set the value of the FE field 506 to "1" to indicate the checksum failure. The feedback packet 500 (FIG. 5) may include one of SN 101-150 in the recent SN field 516.

At 1036, prior to receiving the memory reset request transmitted by the receiving device 1012 at 1034 and after performing the memory reset request associated with the memory reset request transmitted by the receiving device 1012 at 1028, the transmitting device 1010 may transmit the packets[SN 151-200] to the receiving device 1012. One or more packets may be lost (e.g., the packet[SN 151]. In one example, the transmitting device 1010 may transmit the packet[SN 151-200] via the PDU 600 (FIG. 6). The packets [SN 151-200] and/or information in the packets[SN 151-200] may be embedded in the one or more information block 630 of the PDU 600. The SN field 614 of the PDU 600 may include the SN 201-250. The FR field 622 may indicate that the compression memory has been reset. The checksum field 628 may include a checksum value for the packets[SN 151-200].

Due to the lost packet[SN 151], the receiving device 1012 may be unable to decompress and/or decode the remaining packets[SN 152-200] and determine a checksum failure. In one instance, the receiving device 1012 may be unable to decompress and/or decode the packets[SN 152-200] because one or more pointers in the packets[SN 152-200] points to the lost packet[SN 151].

In certain aspects of the present disclosure, after transmitting the packets[SN 151-200] at 1036, the transmitting device 1010 may receive the memory reset request transmitted by the receiving device 1012 at 1034. The transmitting device 1010 may compare the recent SN (i.e., one of SN 101-150) embedded in the memory reset request with a reset SN associated with data transmitted immediately after the previous memory reset. The data transmitted immediately after the previous memory reset may be the first packet (i.e., the packet[SN 151]), the first group of packets (i.e., the packets[SN 151-160]), or the first data unit (i.e., the packets [SN 151-200]) transmitted after the previous memory reset without intermittent transmission. The transmitting device 1010 may determine that the recent SN is less than the reset SN (SN 150<SN 151), and consequently, may not perform the memory reset. The transmitting device 1010 may determine, based on the recent SN value and the status of the memory reset, that the memory reset request transmitted by the receiving device 1012 at 1034 occurs in response to data transmitted prior to the previous memory request (memory request due to the request at 1028). Therefore, the receiving device 1012 will be able to decompress and/or decode data after the previous memory reset.

At 1038, the transmitting device 1010 may transmit the packets[SN 201-250] to the receiving device 1012. Due to the lost packet[SN 151] at 1036, after receiving the packets [SN 201-250], the receiving device 1012 may be unable to decompress and/or decode the packets[SN 201-250] and determine a checksum failure.

At 1040, in response to the checksum failure for the packets[SN 201-250], the receiving device 1012 may transmit a memory reset request (after another $t_{reordering}$ timer has expired, not shown) to the transmitting device 1010 to reset the compression memory of the transmitting device 1010. The memory reset request may include a recent SN (e.g., one of SN 201-250) associated with the checksum failure of the packets[SN 201-250]. In a particular implementation, the memory reset request may include the last SN (e.g., SN 250) associated with the checksum failure of the packets[SN 201-250]. In one example, the receiving device 1012 may transmit the feedback packet 500 (FIG. 5) and may set the value of the FE field 506 to "1" to indicate the checksum failure. The feedback packet 500 (FIG. 5) may include one of SN 201-205 in the recent SN field 516.

In an aspect of the current disclosure, after the transmission of the packets[SN 201-250] at 1038, the transmitting device 1010 may receive the memory reset request transmitted by the receiving device 1012 at 1040. The transmitting device 1010 may compare the recent SN (i.e., one of SN 201-250) embedded in the memory reset request with a reset SN associated with data transmitted immediately after the previous memory reset. The data transmitted immediately after the previous memory reset may be the first packet (i.e., the packet[SN 151]), the first group of packets (i.e., the packets[SN 151-170]), or the first data unit (i.e., the packets [SN 151-200]) transmitted after the previous memory reset without intermittent transmission. The transmitting device 1010 may determine that the recent SN is greater than the reset SN (SN 201>SN 200), and consequently, may perform the compression memory reset.

At 1042, the transmitting device 1010 may transmit the packets[SN 251-300] to the receiving device 1012. In one example, the transmitting device 1010 may transmit the packet[SN 251-300] via the PDU 600 (FIG. 6). The packets [SN 251-300] and/or information in the packets[SN 251-300] may be embedded in the one or more information block 630 of the PDU 600. The SN field 614 of the PDU 600 may include the SN 251-300. The FR field 622 may indicate that the compression memory has been reset. The checksum field 628 may include a checksum value for the packets[SN 251-300].

Due to the compression memory reset requested by the receiving device 1012 at 1040, after receiving the packets [SN 251-300], the receiving device 1012 may be able to decompress and/or decode the packets[SN 251-300] and determine a checksum success. In one implementation, the receiving device 1012 may be able to decompress and/or decode the packets[SN 251-300] because pointers in the packets[SN 251-300] do not point to the packets[SN 151-200] due to the memory reset requested by the receiving device 1012 at 1040.

Figure 11:
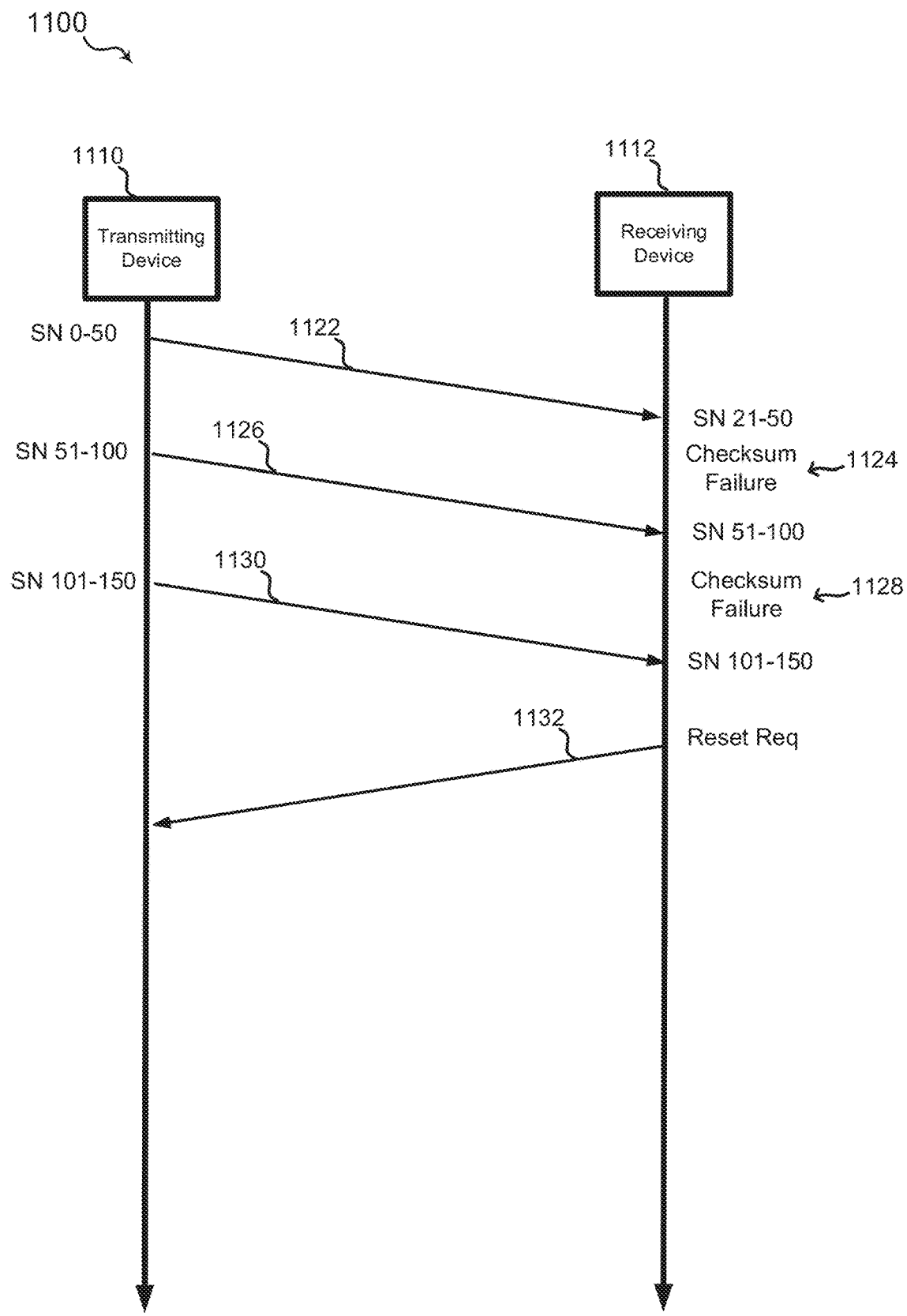
FIG. 11 is a fifth example of a flowchart according to aspects of the present disclosure.

Turning to FIG. 11, in some aspects of the present disclosure, a fifth example of a flowchart 1100 may include a transmitting device 1110 (e.g., the UE 110 or the BS 105) and a receiving device 1112 (e.g., the BS 105 or the UE 110). The flowchart 1100 may illustrate an implementation including the transmitting device 1110 postponing the transmission of a memory reset request. At 1122, the transmitting device 1110 may transmit compressed packets having sequence numbers 0-50 (denoted as packets[SN 0-50]) to the receiving device 1112. The receiving device 1112 may receive the packets[SN 21-50] without the packets[SN 0-20] because the packets[SN 0-20] are lost (e.g., not properly received, corrupted, etc.). However, the receiving device 1112 may be unable to decompress and/or decode at least a portion of the packets[SN 21-50] because the packets[SN 21-50] include pointers (based on LZ77 and/or Huffman coding as described above) to the packets[SN 0-20].

At 1124, the receiving device 1112 may determine a first checksum failure associated with the packets[SN 21-50] due to the missing packets[SN 0-20]. In one aspect of the current disclosure, the receiving device 1112 may refrain from transmitting a memory reset request to the transmitting device 1110 regarding the first checksum failure associated with the packets[SN 21-50].

At 1126, the transmitting device 1110 may transmit the packets[SN 51-100] to the receiving device 1112.

At 1128, the receiving device 1112 may determine a second checksum failure associated with the packets[SN 51-100] due to the missing packets[SN 0-20]. In one aspect of the current disclosure, the receiving device 1112 may refrain from transmitting another memory reset request to the transmitting device 1110 regarding the second checksum failure associated with the packets[SN 51-100].

At 1130, the transmitting device 1110 may transmit the packets[SN 101-150] to the receiving device 1112.

At 1132, the receiving device 1112 may determine a third checksum failure associated with the packets[SN 101-150] due to the missing packets[SN 0-20]. In response to the third checksum failure, the receiving device 1112 may transmit a memory reset request to the transmitting device 1110 to reset the compression memory of the transmitting device 1110. The memory reset request may include a recent SN (e.g., one of SN 101-150) associated with the checksum failure of the packets[SN 101-150]. The latest processed sequence number may be SN 150. In a particular implementation, the memory reset request may include the last SN (e.g., SN 150) associated with the checksum failure of the packets[SN 101-150]. In one example, the receiving device 1112 may transmit the feedback packet 500 (FIG. 5) and may set the value of the FE field 506 to "1" to indicate the checksum failure. The feedback packet 500 (FIG. 5) may include one of SN 101-150 in the recent SN field 516. In other implementations, the memory reset request may include one of SN 21-150.

In some implementations, the receiving device 1112 may aggregate a certain numbers of checksum failures (e.g., 2-10) prior to transmitting the memory reset request. In another implementation, the receiving device 1112 may aggregate a certain numbers of checksum failures within a certain time frame prior to transmitting the memory reset request. In another instance, the receiving device 1112 may aggregate the checksum failures within a certain time frame prior (e.g., 10 milliseconds (ms), 20 ms, 50 ms, 100 ms, etc.) prior to transmitting the memory reset request. In some implementations, the receiving device 1112 may aggregate the checksum failures associated with a certain data unit prior to transmitting the memory reset request. Other criteria for aggregating the checksum failures may be implemented.

Figure 12:
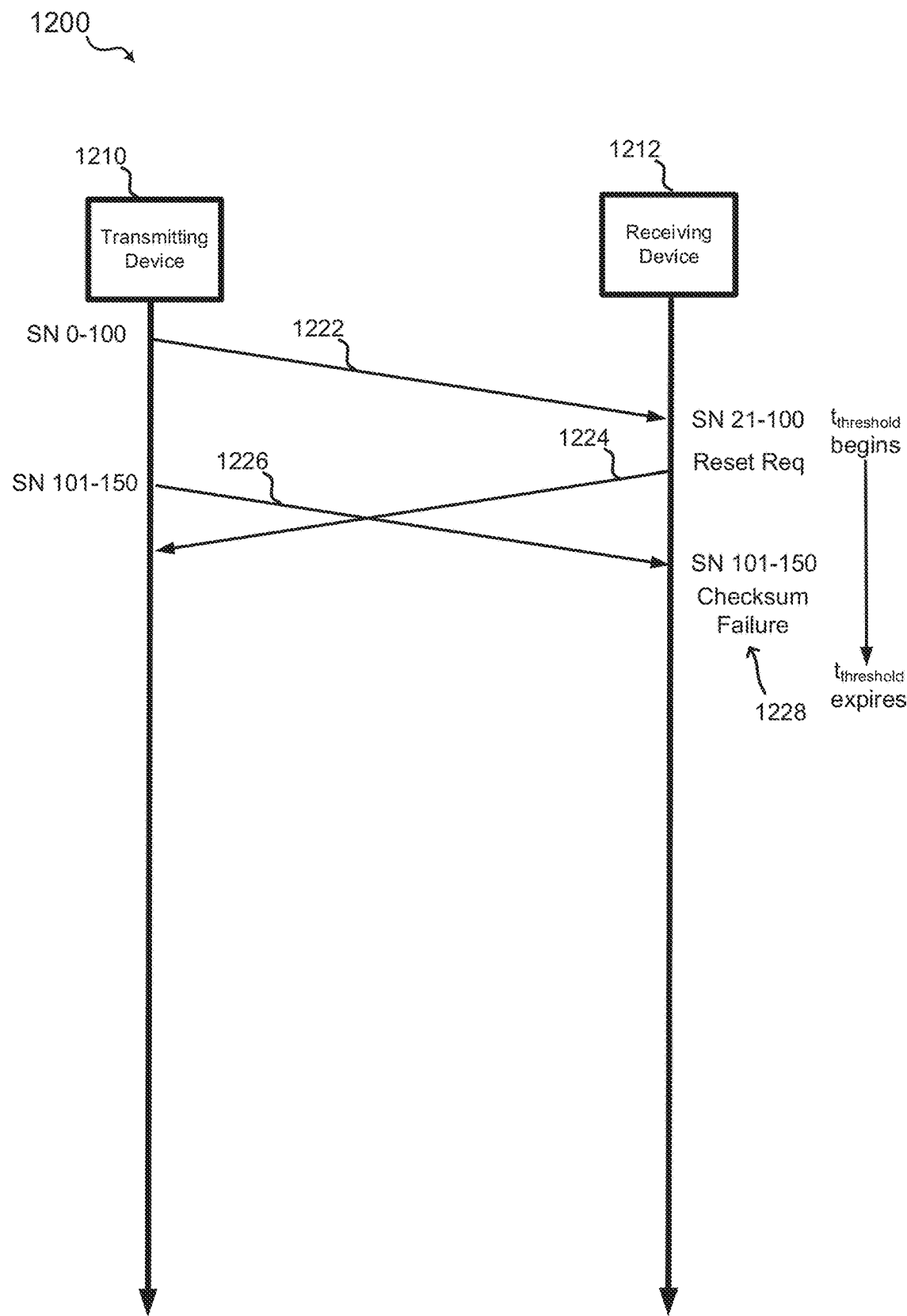
FIG. 12 is a sixth example of a flowchart according to aspects of the present disclosure.

Turning to FIG. 12, in some aspects of the present disclosure, a sixth example of a flowchart 1200 may include a transmitting device 1210 (e.g., the UE 110 or the BS 105) and a receiving device 1212 (e.g., the BS 105 or the UE 110). The flowchart 1200 may illustrate an implementation including the transmitting device 1210 suspending a second memory reset request within a threshold time of a first memory reset request. At 1222, the transmitting device 1210 may transmit compressed packets having sequence numbers 0-50 (denoted as packets[SN 0-100]) to the receiving device 1212. The receiving device 1212 may receive the packets [SN 21-100] without the packets[SN 0-20] because the packets[SN 0-20] are lost (e.g., not properly received, corrupted, etc.). However, the receiving device 1212 may be unable to decompress and/or decode at least a portion of the packets[SN 21-100] because the packets[SN 21-100] include pointers (based on LZ77 and/or Huffman coding as described above) to the packets[SN 0-20].

At 1224, the receiving device 1212 may determine a first checksum failure associated with the packets[SN 21-100] due to the missing packets[SN 0-20]. In response to the first checksum failure, the receiving device 1212 may transmit a first memory reset request to the transmitting device 1210 to reset the compression memory of the transmitting device 1210. The memory reset request may include a recent SN (e.g., one of SN 21-100) associated with the checksum failure of the packets[SN 21-100]. The latest processed sequence number may be SN 100. In a particular implementation, the memory reset request may include the last SN (e.g., SN 100) associated with the checksum failure of the packets[SN 101-150]. In one example, the receiving device 1212 may transmit the feedback packet 500 (FIG. 5) and may set the value of the FE field 506 to "1" to indicate the checksum failure. The feedback packet 500 (FIG. 5) may include one of SN 21-100 in the recent SN field 516.

In one aspect of the present disclosure, after the transmission of the memory reset request, the receiving device 1212 may activate a threshold timer ($t_{threshold}$). The $t_{threshold}$ may last a threshold time. During the threshold time (e.g., 10 ms, 20 ms, 50 ms, 100 ms, 200 ms, etc.), the receiving device 1212 may refrain from transmitting additional memory reset request. The threshold time may be the round trip time for transmissions/receptions between the transmitting device 1210 and the receiving device 1212.

At 1226, the transmitting device 1210 may transmit the packets[SN 101-150] to the receiving device 1212.

At 1228, the receiving device 1212 may determine a second checksum failure associated with the packets[SN 101-150] due to the missing packets[SN 0-20]. The receiving device 1212 may determine the second checksum failure during the threshold time (i.e., $t_{threshold}$ is active). In one aspect of the current disclosure, the receiving device 1212 may refrain from transmitting a second memory reset request to the transmitting device 1210 regarding the second checksum failure associated with the packets[SN 101-150]. In certain aspects, the receiving device 1212 may discard the second memory reset request, or postpone the second memory reset request (e.g., until $t_{threshold}$ expires).

Figure 13:
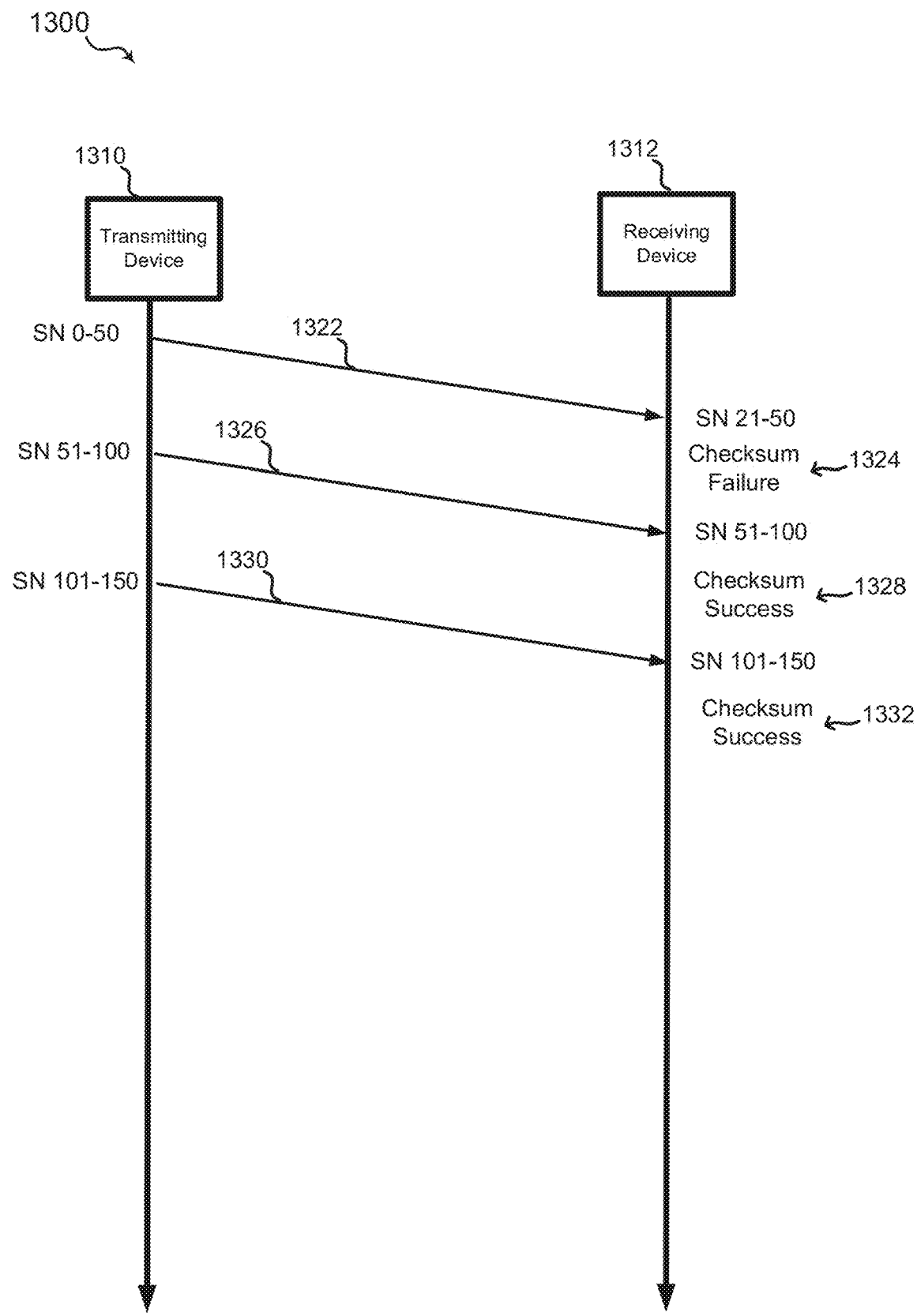
FIG. 13 is a seventh example of a flowchart according to aspects of the present disclosure.

Turning to FIG. 13, in some aspects of the present disclosure, a seventh example of a flowchart 1300 may include a transmitting device 1310 (e.g., the UE 110 or the BS 105) and a receiving device 1312 (e.g., the BS 105 or the UE 110). The flowchart 1300 may illustrate an implementation including the transmitting device 1310 refraining from transmitting a memory reset request if a checksum failure is followed by one or more checksum success. At 1322, the transmitting device 1310 may transmit compressed packets having sequence numbers 0-50 (denoted as packets[SN 0-50]) to the receiving device 1312. The receiving device 1312 may receive the packets[SN 21-50] without the packets [SN 0-20] because the packets[SN 0-20] are lost (e.g., not properly received, corrupted, etc.). However, the receiving device 1312 may be unable to decompress and/or decode at least a portion of the packets[SN 21-50] because the packets [SN 21-50] include pointers (based on LZ77 and/or Huffman coding as described above) to the packets[SN 0-20].

At 1324, the receiving device 1312 may determine a first checksum failure associated with the packets[SN 21-50] due to the missing packets[SN 0-20]. In one aspect of the current disclosure, the receiving device 1312 may refrain from transmitting a memory reset request to the transmitting device 1310 regarding the first checksum failure associated with the packets[SN 21-50].

At 1326, the transmitting device 1310 may transmit the packets[SN 51-100] to the receiving device 1312.

At 1328, the receiving device 1312 may determine a first checksum success associated with the packets[SN 51-100].

At 1330, the transmitting device 1310 may transmit the packets[SN 101-150] to the receiving device 1312.

At 1332, the receiving device 1312 may determine a second checksum success associated with the packets[SN 101-150]. In response to the checksum failure and one or more of the first checksum success and the second checksum success, the receiving device 1312 may refrain from transmitting a memory reset request. For example, the receiving device 1312 may refrain from transmitting a memory reset request after a checksum failure if the receiving device 1312 detects a certain number of checksum successes. In another example, the receiving device 1312 may refrain from transmitting a memory reset request after a checksum failure if the receiving device 1312 detects a certain number of checksum successes within a predetermined time frame.

Figure 14:
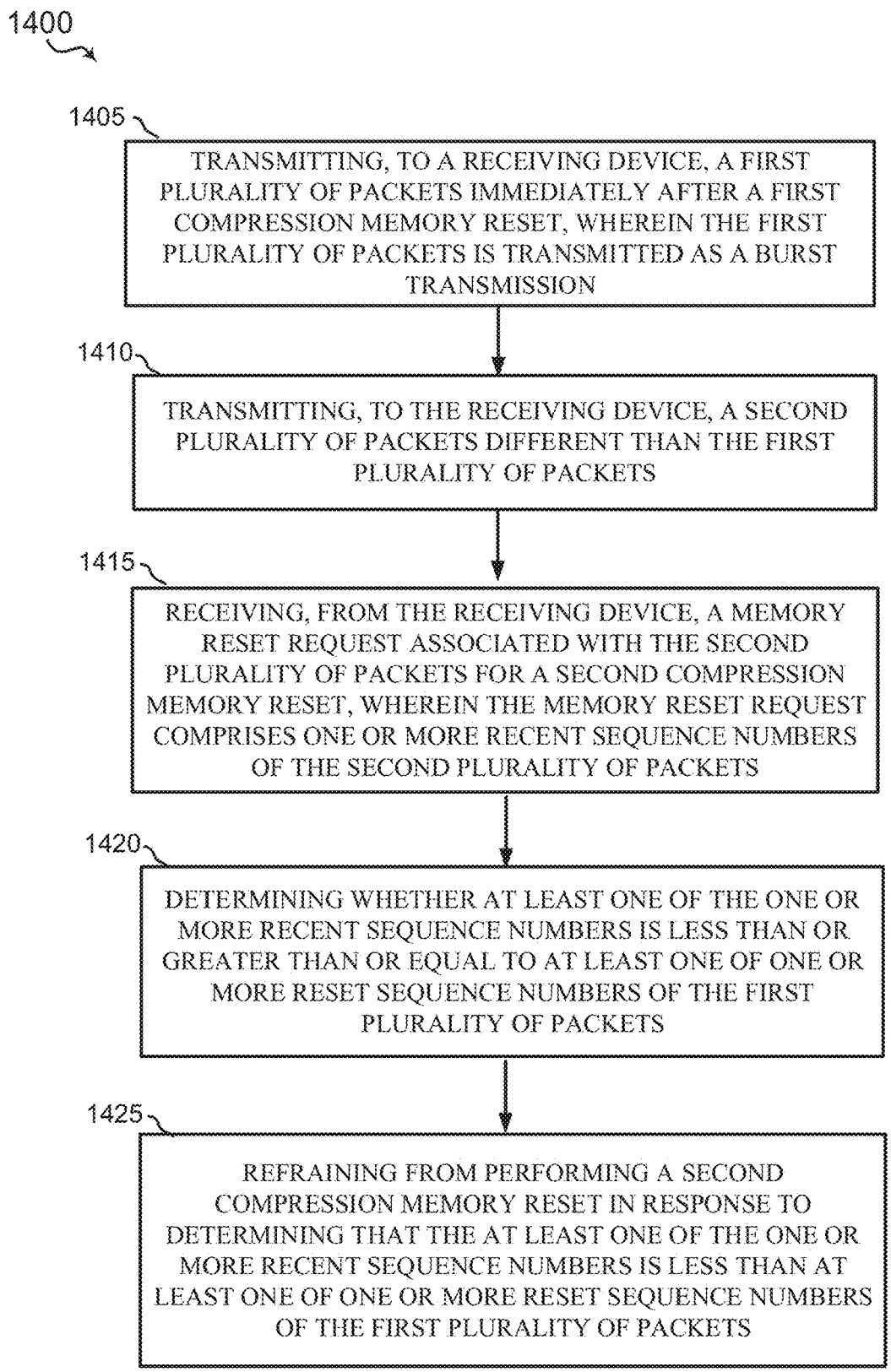
FIG. 14 is a process flow diagram of an example of a method for resetting compression memory performed by a transmitting device.

Referring to FIG. 14, an example of a method 1400 for performing a compression memory reset may be performed by a transmitting device (e.g., BS 105 or UE 110) or components of the transmitting device, such as one or more of the processor 212, the memory 216, the applications 275, the modem 220, the transceiver 202 and/or its subcomponents, the RF front end 288 and/or its subcomponents, the communication component 222, and/or the determination component 224 of the UE 110 and/or one or more of the processor 312, the memory 316, the applications 375, the modem 320, the transceiver 302 and/or its subcomponents, the RF front end 388 and/or its subcomponents, the communication component 322, and/or the determination component 324 of the BS 105 in the wireless communication network 100.

At block 1405, the method 1400 may transmit, to a receiving device, a first plurality of packets immediately after a first compression memory reset, wherein the first plurality of packets is transmitted as a burst transmission. For example, the communication component 222, the modem 220, and/or the processor 212 of the UE 110 may transmit a first plurality of packets immediately after a first compression memory reset, wherein the first plurality of packets is transmitted as a burst transmission. The first plurality of packets may be a transmitted in a continuous burst. The continuous burst may indicate that the first plurality of packets are transmitted without transmitting and/or receiving any interleaving packets in between. The first plurality of packets may be encoded with a single checksum. The communication component 222 may send the first plurality of packets to the transceiver 202 or the transmitter 208. The transceiver 202 or the transmitter 208 may convert the first plurality of packets to electrical signals and send to the RF front end 288. The RF front end 288 may filter and/or amplify the electrical signals. The RF front end 288 may send the electrical signals as electro-magnetic signals via the one or more antennas 265.

In certain implementations, the processor 212, the modem 220, the communication component 222, the transceiver 202, the receiver 206, the transmitter 208, the RF front end 288, and/or the subcomponents of the RF front end 288 may be configured to and/or may define means for transmitting, to a receiving device, a first plurality of packets immediately after a first compression memory reset, wherein the first plurality of packets is transmitted as a burst transmission.

At block 1410, the method 1400 may transmit, to the receiving device, a second plurality of packets different than the first plurality of packets. For example, the communication component 222, the modem 220, and/or the processor 212 of the UE 110 may transmit, to the receiving device, a second plurality of packets different than the first plurality of packets. In an aspect, the data information in the first plurality of packets may be the same or different than the data information in the second plurality of packets. For example, the data information in the second plurality of packets may include redundant data information of the first plurality of packets. Alternatively, the data information in the second plurality of packets may be different than the data information of the first plurality of packets. The communication component 222 may send the second plurality of packets to the transceiver 202 or the transmitter 208. The transceiver 202 or the transmitter 208 may convert the second plurality of packets to electrical signals and send to the RF front end 288. The RF front end 288 may filter and/or amplify the electrical signals. The RF front end 288 may send the electrical signals as electro-magnetic signals via the one or more antennas 265.

In certain implementations, the processor 212, the modem 220, the communication component 222, the transceiver 202, the receiver 206, the transmitter 208, the RF front end 288, and/or the subcomponents of the RF front end 288 may be configured to and/or may define means for transmitting, to the receiving device, a second plurality of packets different than the first plurality of packets.

At block 1415, the method 1400 may receive, from the receiving device, a memory reset request associated with the second plurality of packets for a second compression memory reset, wherein the memory reset request comprises one or more recent sequence numbers of the second plurality of packets. For example, the communication component 222, the modem 220, and/or the processor 212 of the UE 110 may receive, from the receiving device, a memory reset request associated with the second plurality of packets for a second compression memory reset, wherein the memory reset request comprises one or more recent sequence numbers of the second plurality of packets. The one or more antennas 265 may receive electro-magnetic signals associated with the memory reset request and convert the electro-magnetic signals into electrical signals. The RF front end 288 may filter and/or amplify the electrical signals. The RF front end 288 may send the electrical signals to the transceiver 202 or the receiver 206. The transceiver 202 or the receiver 206 may convert the electrical signals into digital signals and send to the communication component 222.

In certain implementations, the processor 212, the modem 220, the communication component 222, the transceiver 202, the receiver 206, the transmitter 208, the RF front end 288, and/or the subcomponents of the RF front end 288 may be configured to and/or may define means for receiving, from the receiving device, a memory reset request associated with the second plurality of packets for a second compression memory reset, wherein the memory reset request comprises one or more recent sequence numbers of the second plurality of packets.

At block 1420, the method 1400 may determine whether at least one of the one or more recent sequence numbers is less than or greater than or equal to at least one of one or more reset sequence numbers of the first plurality of packets. For example, the determination component 224, the modem 220, and/or the processor 212 of the UE 110 may determine whether at least one of the one or more recent sequence numbers is less than or greater than or equal to at least one of one or more reset sequence numbers of the first plurality of packets.

In certain implementations, the processor 212, the modem 220, the determination component 224, the transceiver 202, the receiver 206, the transmitter 208, the RF front end 288, and/or the subcomponents of the RF front end 288 may be configured to and/or may define means for determining whether at least one of the one or more recent sequence numbers is less than or greater than or equal to at least one of one or more reset sequence numbers of the first plurality of packets.

At block 1425, the method 1400 may refrain from performing a second compression memory reset in response to determining that the at least one of the one or more recent sequence numbers is less than at least one of one or more reset sequence numbers of the first plurality of packets. For example, the determination component 224, the modem 220, and/or the processor 212 of the UE 110 may refrain from performing a second compression memory reset in response to determining that the at least one of the one or more recent sequence numbers is less than at least one of one or more reset sequence numbers of the first plurality of packets.

In certain implementations, the processor 212, the modem 220, the determination component 224, the transceiver 202, the receiver 206, the transmitter 208, the RF front end 288, and/or the subcomponents of the RF front end 288 may be configured to and/or may define means for refraining from performing a second compression memory reset in response to determining that the at least one of the one or more recent sequence numbers is less than at least one of one or more reset sequence numbers of the first plurality of packets.

Alternatively or additionally, the method 1400 may further include any of the methods above, further comprising performing the second compression memory reset in response to determining that the at least one of the one or more recent sequence numbers is greater than at least one of one or more reset sequence numbers of the first plurality of packets.

Alternatively or additionally, the method 1400 may further include any of the methods above, wherein transmitting the first plurality of packets comprises transmitting an indicator indicating the first compression memory reset.

Alternatively or additionally, the method 1400 may further include any of the methods above, wherein transmitting the first plurality of packets comprises transmitting a checksum value associated with the first plurality of packets.

Alternatively or additionally, the method 1400 may further include any of the methods above, wherein transmitting the second plurality of packets comprises transmitting a checksum value associated with the second plurality of packets.

Alternatively or additionally, the method 1400 may further include any of the methods above, further comprising compressing the first plurality of packets into a first plurality of compressed packets and the second plurality of packets into a second plurality of compressed packets, wherein transmitting the first plurality of packets comprises transmitting the first plurality of compressed packets, and wherein transmitting the second plurality of packets comprises transmitting the second plurality of compressed packets.

Alternatively or additionally, the method 1400 may further include any of the methods above, wherein compressing the at least one of the plurality of packets or the second plurality of packets comprises compressing using one of LZ77 algorithm or Huffman coding.

Figure 15:
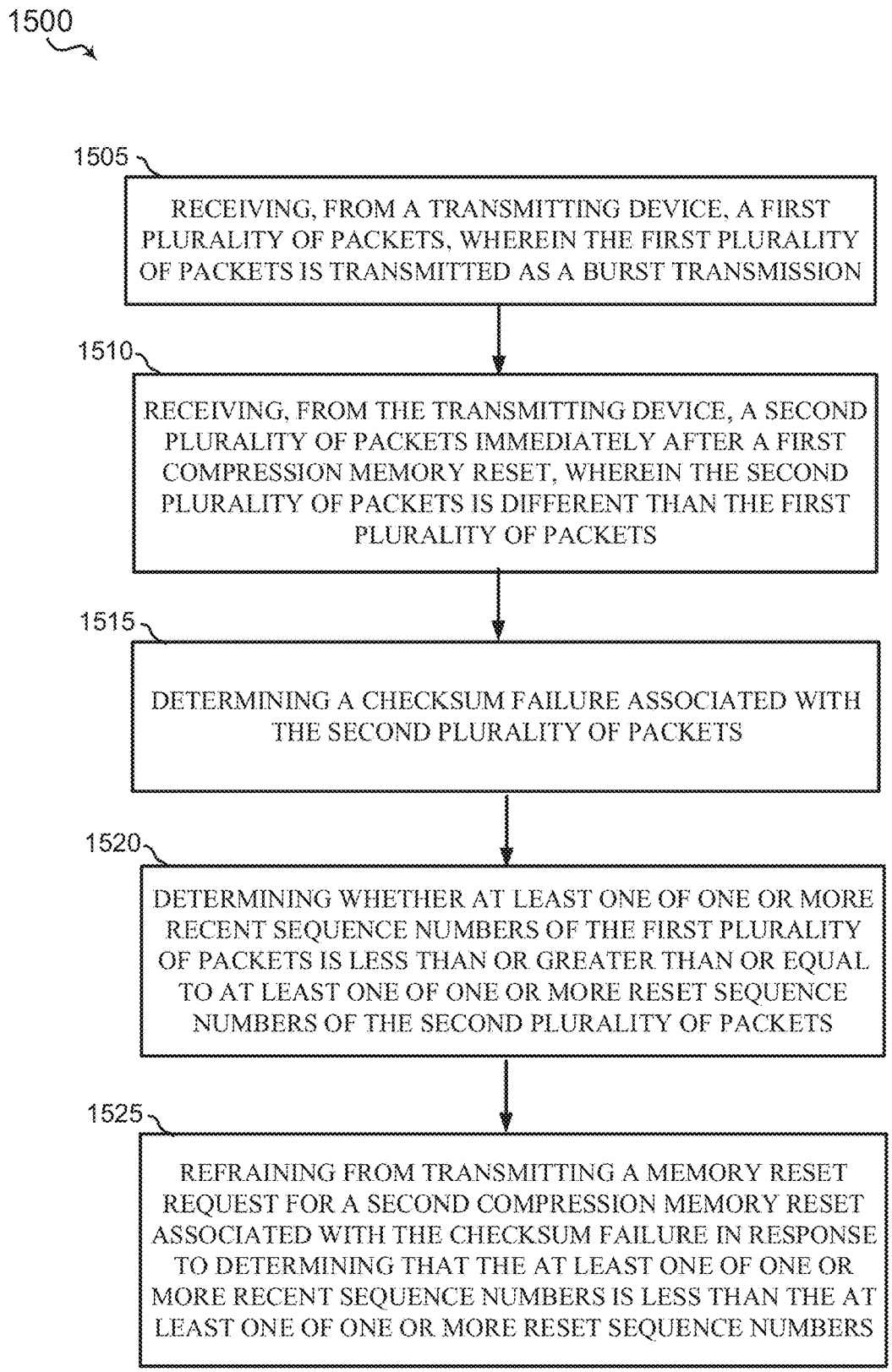
FIG. 15 is a process flow diagram of an example of a method for transmitting a memory reset request performed by a receiving device.

Referring to FIG. 15, an example of a method 1500 for performing a compression memory reset may be performed by a receiving device (e.g., BS 105 or UE 110) or components of the receiving device, such as one or more of the processor 212, the memory 216, the applications 275, the modem 220, the transceiver 202 and/or its subcomponents, the RF front end 288 and/or its subcomponents, the communication component 222, and/or the determination component 224 of the UE 110 and/or one or more of the processor 312, the memory 316, the applications 375, the modem 320, the transceiver 302 and/or its subcomponents, the RF front end 388 and/or its subcomponents, the communication component 322, and/or the determination component 324 of the BS 105 in the wireless communication network 100.

At block 1505, the method 1500 may receive, from a transmitting device, a first plurality of packets, wherein the first plurality of packets is transmitted as a burst transmission. For example, the communication component 322, the modem 320, and/or the processor 312 of the BS 105 may receive, from a transmitting device, a first plurality of packets, wherein the first plurality of packets is transmitted as a burst transmission. The first plurality of packets may be a transmitted in a continuous burst. The continuous burst may indicate that the first plurality of packets are transmitted without transmitting and/or receiving any interleaving packets in between. The first plurality of packets may be encoded with a single checksum. The one or more antennas 365 may receive electro-magnetic signals associated with the first plurality of packets and convert the electro-magnetic signals into electrical signals. The RF front end 388 may filter and/or amplify the electrical signals. The RF front end 388 may send the electrical signals to the transceiver 302 or the receiver 306. The transceiver 302 or the receiver 306 may convert the electrical signals into digital signals and send to the communication component 322.

In certain implementations, the processor 312, the modem 320, the communication component 322, the transceiver 302, the receiver 306, the transmitter 308, the RF front end 388, and/or the subcomponents of the RF front end 388 may be configured to and/or may define means for receiving, from a transmitting device, a first plurality of packets.

At block 1510, the method 1500 may receive, from the transmitting device, a second plurality of packets immediately after a first compression memory reset, wherein the second plurality of packets is different than the first plurality of packets. For example, the communication component 322, the modem 320, and/or the processor 312 of the BS 105 may receive, from the transmitting device, a second plurality of packets immediately after a first compression memory reset, wherein the second plurality of packets is different than the first plurality of packets. In an aspect, the data information in the first plurality of packets may be the same or different than the data information in the second plurality of packets. For example, the data information in the second plurality of packets may include redundant data information of the first plurality of packets. Alternatively, the data information in the second plurality of packets may be different than the data information of the first plurality of packets. The one or more antennas 365 may receive electro-magnetic signals associated with the second plurality of packets and convert the electro-magnetic signals into electrical signals. The RF front end 388 may filter and/or amplify the electrical signals. The RF front end 388 may send the electrical signals to the transceiver 302 or the receiver 306. The transceiver 302 or the receiver 306 may convert the electrical signals into digital signals and send to the communication component 322.

In certain implementations, the processor 312, the modem 320, the communication component 322, the transceiver 302, the receiver 306, the transmitter 308, the RF front end 388, and/or the subcomponents of the RF front end 388 may be configured to and/or may define means for receiving, from the transmitting device, a second plurality of packets immediately after a first compression memory reset, wherein the second plurality of packets is different than the first plurality of packets.

At block 1515, the method 1500 may determine a checksum failure associated with the second plurality of packets. For example, the determination component 324, the modem 320, and/or the processor 312 of the BS 105 may determine a checksum failure associated with the second plurality of packets.

In certain implementations, the processor 312, the modem 320, the determination component 324, the transceiver 302, the receiver 306, the transmitter 308, the RF front end 388, and/or the subcomponents of the RF front end 388 may be configured to and/or may define means for determining a checksum failure associated with the second plurality of packets.

At block 1520, the method 1500 may determine whether at least one of one or more recent sequence numbers of the first plurality of packets is less than or greater than or equal to at least one of one or more reset sequence numbers of the second plurality of packets. For example, the determination component 324, the modem 320, and/or the processor 312 of the BS 105 may determine whether at least one of one or more recent sequence numbers of the first plurality of packets is less than or greater than or equal to at least one of one or more reset sequence numbers of the second plurality of packets.

In certain implementations, the processor 312, the modem 320, the determination component 324, the transceiver 302, the receiver 306, the transmitter 308, the RF front end 388, and/or the subcomponents of the RF front end 388 may be configured to and/or may define means for determining whether at least one of one or more recent sequence numbers of the first plurality of packets is less than or greater than or equal to at least one of one or more reset sequence numbers of the second plurality of packets.

At block 1525, the method 1500 may refrain from transmitting a memory reset request for a second compression memory reset associated with the checksum failure in response to determining that the at least one of one or more recent sequence numbers is less than the at least one of one or more reset sequence numbers. For example, the determination component 324, the modem 320, and/or the processor 312 of the BS 105 may refrain from transmitting a memory reset request for a second compression memory reset associated with the checksum failure in response to determining that the at least one of one or more recent sequence numbers is less than the at least one of one or more reset sequence numbers.

In certain implementations, the processor 312, the modem 320, the determination component 324, the transceiver 302, the receiver 306, the transmitter 308, the RF front end 388, and/or the subcomponents of the RF front end 388 may be configured to and/or may define means for refraining from transmitting a memory reset request for a second compression memory reset associated with the checksum failure in response to determining that the at least one of one or more recent sequence numbers is less than the at least one of one or more reset sequence numbers.

Alternatively or additionally, the method 1500 may further include any of the methods above, further comprising transmitting the memory reset request for the second compression memory reset associated with the checksum failure in response to determining that the at least one of one or more recent sequence numbers is greater than the at least one of one or more reset sequence numbers.

Alternatively or additionally, the method 1500 may further include any of the methods above, further comprising triggering a reordering timer, failing to decompress at least one of the second plurality of packets after an expiration of the reordering timer, and wherein determining the checksum failure comprises determining the checksum failure after the reordering timer expires.

Alternatively or additionally, the method 1500 may further include any of the methods above, wherein receiving the second plurality of packets comprises receiving an indicator indicating the first compression memory reset.

Alternatively or additionally, the method 1500 may further include any of the methods above, wherein receiving the first plurality of packets comprises receiving a checksum value associated with the first plurality of packets.

Alternatively or additionally, the method 1500 may further include any of the methods above, wherein receiving the second plurality of packets comprises receiving a checksum value associated with the second plurality of packets.

Alternatively or additionally, the method 1500 may further include any of the methods above, further comprising decompressing the first plurality of packets into a first plurality of decompressed packets and the second plurality of packets into a second plurality of decompressed packets.

Alternatively or additionally, the method 1500 may further include any of the methods above, wherein decompressing the at least one of the plurality of packets or the second plurality of packets comprises decompressing using one of LZ77 algorithm or Huffman coding.

Figure 16:
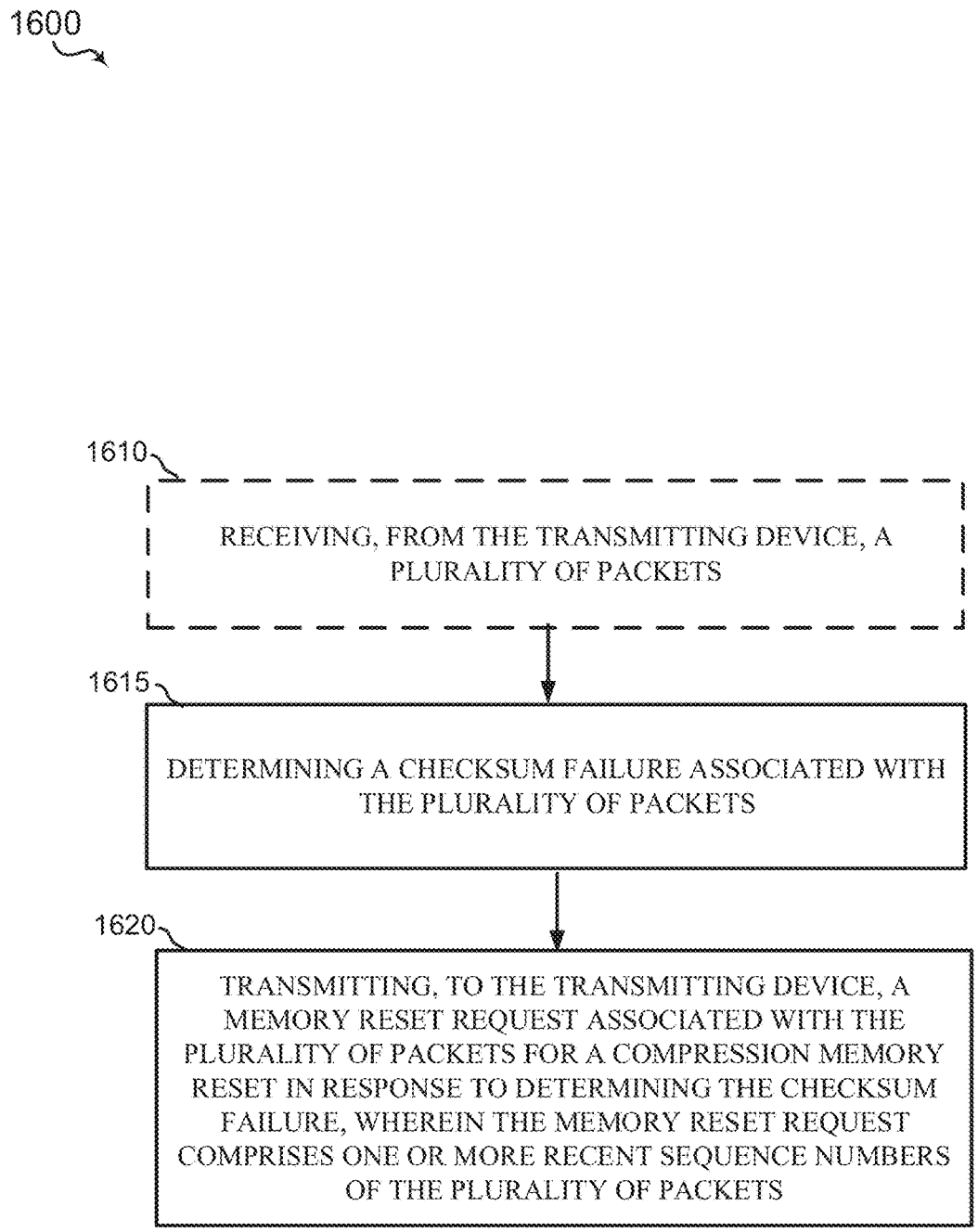
FIG. 16 is a process flow diagram of an example of a method for transmitting a memory reset request performed by a receiving device.

Referring to FIG. 16, an example of a method 1600 for transmitting a memory reset request may be performed by a receiving device (e.g., BS 105 or UE 110) or components of the receiving device, such as one or more of the processor 212, the memory 216, the applications 275, the modem 220, the transceiver 202 and/or its subcomponents, the RF front end 288 and/or its subcomponents, the communication component 222, and/or the determination component 224 of the UE 110 and/or one or more of the processor 312, the memory 316, the applications 375, the modem 320, the transceiver 302 and/or its subcomponents, the RF front end 388 and/or its subcomponents, the communication component 322, and/or the determination component 324 of the BS 105 in the wireless communication network 100.

At block 1610, the method 1600 may optionally receive, from the transmitting device, a plurality of packets. For example, the communication component 322, the modem 320, and/or the processor 312 of the BS 105 may receive, from the transmitting device, a plurality of packets. The one or more antennas 365 may receive electro-magnetic signals associated with the second plurality of packets and convert the electro-magnetic signals into electrical signals. The RF front end 388 may filter and/or amplify the electrical signals. The RF front end 388 may send the electrical signals to the transceiver 302 or the receiver 306. The transceiver 302 or the receiver 306 may convert the electrical signals into digital signals and send to the communication component 322.

In certain implementations, the processor 312, the modem 320, the communication component 322, the transceiver 302, the receiver 306, the transmitter 308, the RF front end 388, and/or the subcomponents of the RF front end 388 may be configured to and/or may define means for receiving, from the transmitting device, a plurality of packets.

At block 1615, the method 1600 may determine a checksum failure associated with the plurality of packets. For example, the determination component 324, the modem 320, and/or the processor 312 of the BS 105 may determine a checksum failure associated with the plurality of packets.

In certain implementations, the processor 312, the modem 320, the determination component 324, the transceiver 302, the receiver 306, the transmitter 308, the RF front end 388, and/or the subcomponents of the RF front end 388 may be configured to and/or may define means for determining a checksum failure associated with the plurality of packets.

At block 1620, the method 1600 may transmit, to the transmitting device, a memory reset request associated with the plurality of packets for a compression memory reset in response to determining the checksum failure, wherein the memory reset request comprises one or more recent sequence numbers of the plurality of packets. For example, the communication component 322, the modem 320, and/or the processor 312 of the BS 105 may transmit, to the transmitting device, a memory reset request associated with the plurality of packets for a compression memory reset in response to determining the checksum failure, wherein the memory reset request comprises one or more recent sequence numbers of the plurality of packets. The communication component 322 may send the memory reset request to the transceiver 302 or the transmitter 308. The transceiver 302 or the transmitter 308 may convert the memory reset request to electrical signals and send to the RF front end 388. The RF front end 388 may filter and/or amplify the electrical signals. The RF front end 388 may send the electrical signals as electro-magnetic signals via the one or more antennas 365.

In certain implementations, the processor 312, the modem 320, the communication component 322, the transceiver 302, the receiver 306, the transmitter 308, the RF front end 388, and/or the subcomponents of the RF front end 388 may be configured to and/or may define means for transmitting, to the transmitting device, a memory reset request associated with the plurality of packets for a compression memory reset in response to determining the checksum failure, wherein the memory reset request comprises one or more recent sequence numbers of the plurality of packets.

Figure 17:
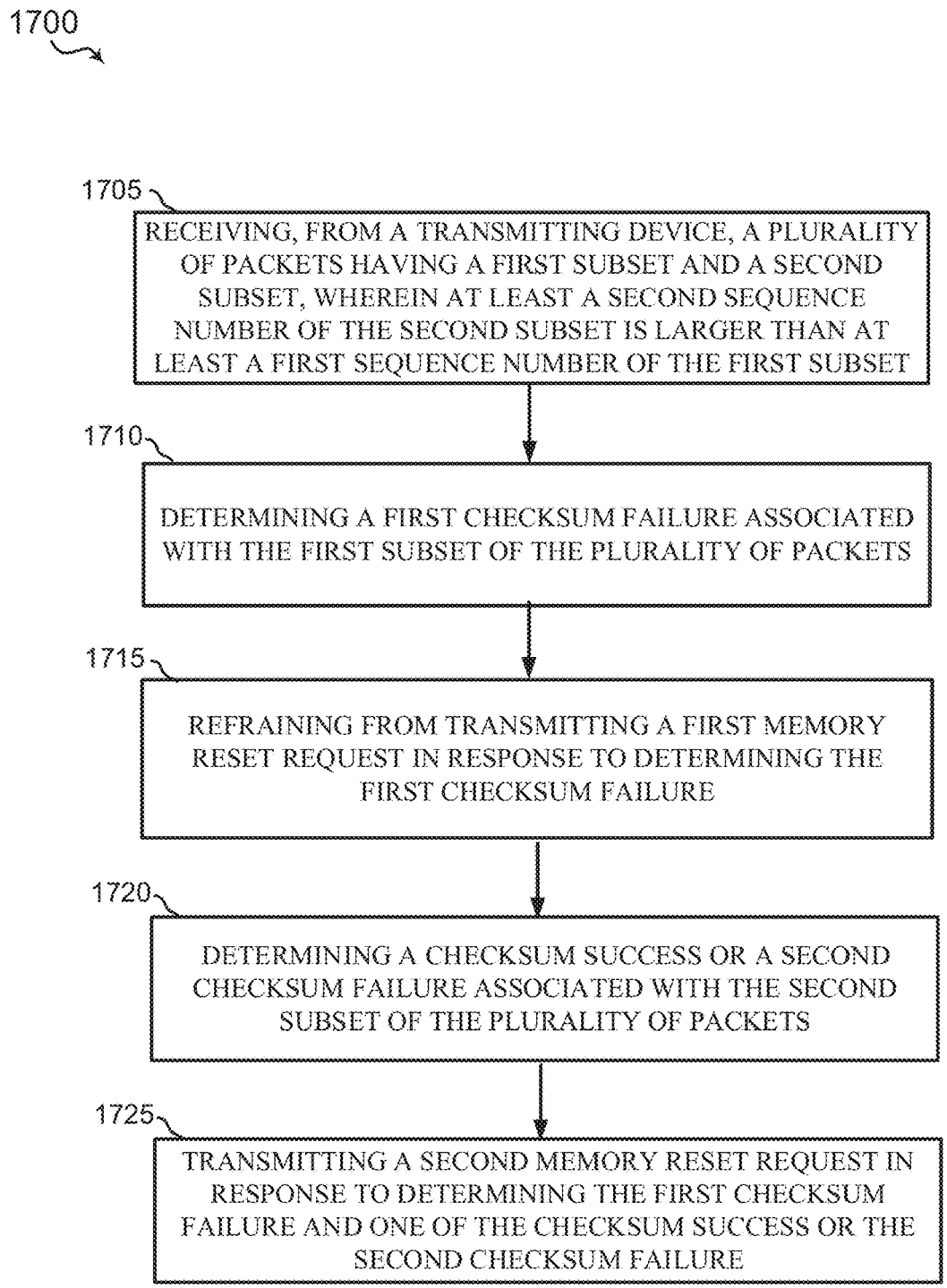
FIG. 17 is a process flow diagram of an example of a method for transmitting an aggregated memory reset request performed by a receiving device.

Referring to FIG. 17, an example of a method 1700 for transmitting an aggregated memory reset request may be performed by a receiving device (e.g., BS 105 or UE 110) or components of the receiving device, such as one or more of the processor 212, the memory 216, the applications 275, the modem 220, the transceiver 202 and/or its subcomponents, the RF front end 288 and/or its subcomponents, the communication component 222, and/or the determination component 224 of the UE 110 and/or one or more of the processor 312, the memory 316, the applications 375, the modem 320, the transceiver 302 and/or its subcomponents, the RF front end 388 and/or its subcomponents, the communication component 322, and/or the determination component 324 of the BS 105 in the wireless communication network 100.

At block 1705, the method 1700 may receive, from a transmitting device, a plurality of packets having a first subset and a second subset, wherein at least a second sequence number of the second subset is larger than at least a first sequence number of the first subset. For example, the communication component 322, the modem 320, and/or the processor 312 of the BS 105 may receive, from a transmitting device, a plurality of packets having a first subset and a second subset, wherein at least a second sequence number of the second subset is larger than at least a first sequence number of the first subset. The one or more antennas 365 may receive electro-magnetic signals associated with the first plurality of packets and convert the electro-magnetic signals into electrical signals. The RF front end 388 may filter and/or amplify the electrical signals. The RF front end 388 may send the electrical signals to the transceiver 302 or the receiver 306. The transceiver 302 or the receiver 306 may convert the electrical signals into digital signals and send to the communication component 322.

In certain implementations, the processor 312, the modem 320, the communication component 322, the transceiver 302, the receiver 306, the transmitter 308, the RF front end 388, and/or the subcomponents of the RF front end 388 may be configured to and/or may define means for receiving, from a transmitting device, a plurality of packets having a first subset and a second subset, wherein at least a second sequence number of the second subset is larger than at least a first sequence number of the first subset.

At 1710, the method 1700 may determine a first checksum failure associated with the first subset of the plurality of packets. For example, the determination component 324, the modem 320, and/or the processor 312 of the BS 105 may determine a first checksum failure associated with the first subset of the plurality of packets.

In certain implementations, the processor 312, the modem 320, the determination component 324, the transceiver 302, the receiver 306, the transmitter 308, the RF front end 388, and/or the subcomponents of the RF front end 388 may be configured to and/or may define means for determining a first checksum failure associated with the first subset of the plurality of packets.

At 1715, the method 1700 may refrain from transmitting a first memory reset request in response to determining the first checksum failure. For example, the determination component 324, the modem 320, and/or the processor 312 of the BS 105 may refrain from transmitting a first memory reset request in response to determining the first checksum failure.

In certain implementations, the processor 312, the modem 320, the determination component 324, the transceiver 302, the receiver 306, the transmitter 308, the RF front end 388, and/or the subcomponents of the RF front end 388 may be configured to and/or may define means for refraining from transmitting a first memory reset request in response to determining the first checksum failure.

At 1720, the method 1700 may determine a checksum success or a second checksum failure associated with the second subset of the plurality of packets. For example, the determination component 324, the modem 320, and/or the processor 312 of the BS 105 may determine a checksum success or a second checksum failure associated with the second subset of the plurality of packets.

In certain implementations, the processor 312, the modem 320, the determination component 324, the transceiver 302, the receiver 306, the transmitter 308, the RF front end 388, and/or the subcomponents of the RF front end 388 may be configured to and/or may define means for determining a checksum success or a second checksum failure associated with the second subset of the plurality of packets.

At 1725, the method 1700 may transmit a second memory reset request in response to determining the first checksum failure and one of the checksum success or the second checksum failure. For example, the communication component 322, the modem 320, and/or the processor 312 of the BS 105 may transmit a second memory reset request in response to determining the first checksum failure and one of the checksum success or the second checksum failure. The communication component 322 may send the second memory reset to the transceiver 302 or the transmitter 308. The transceiver 302 or the transmitter 308 may convert the second memory reset to electrical signals and send to the RF front end 388. The RF front end 388 may filter and/or amplify the electrical signals. The RF front end 388 may send the electrical signals as electro-magnetic signals via the one or more antennas 365.

In certain implementations, the processor 312, the modem 320, the communication component 322, the transceiver 302, the receiver 306, the transmitter 308, the RF front end 388, and/or the subcomponents of the RF front end 388 may be configured to and/or may define means for transmitting a second memory reset request in response to determining the first checksum failure and one of the checksum success or the second checksum failure.

Figure 18:
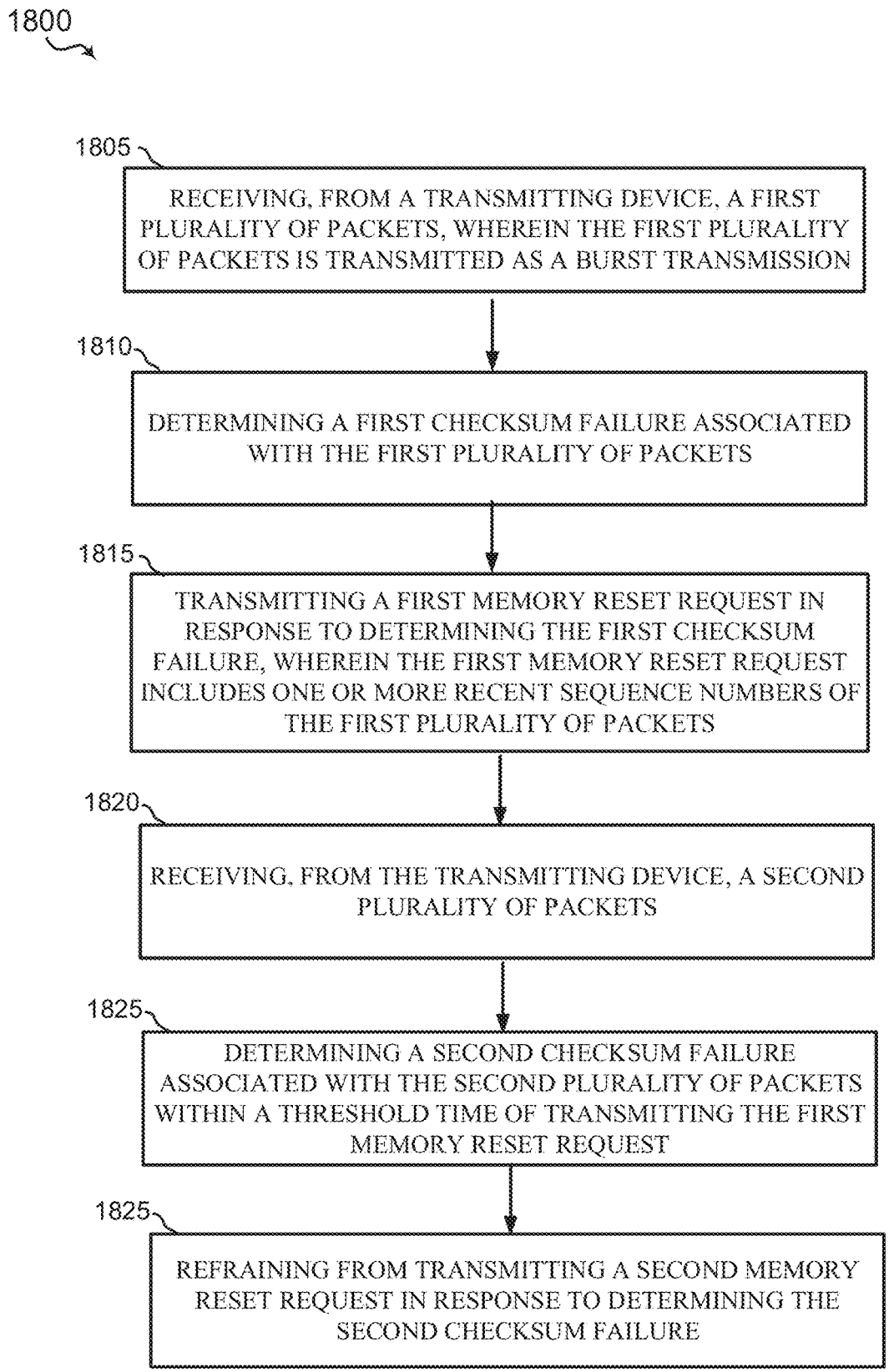
FIG. 18 is a process flow diagram of an example of a method for refraining from transmitting a memory reset request performed by a receiving device.

Referring to FIG. 18, an example of a method 1800 for refraining from transmitting a memory reset request may be performed by a receiving device (e.g., BS 105 or UE 110) or components of the receiving device, such as one or more of the processor 212, the memory 216, the applications 275, the modem 220, the transceiver 202 and/or its subcomponents, the RF front end 288 and/or its subcomponents, the communication component 222, and/or the determination component 224 of the UE 110 and/or one or more of the processor 312, the memory 316, the applications 375, the modem 320, the transceiver 302 and/or its subcomponents, the RF front end 388 and/or its subcomponents, the communication component 322, and/or the determination component 324 of the BS 105 in the wireless communication network 100.

At block 1805, the method 1800 may receive, from a transmitting device, a first plurality of packets, wherein the first plurality of packets is transmitted as a burst transmission. For example, the communication component 322, the modem 320, and/or the processor 312 of the BS 105 may receive, from a transmitting device, a first plurality of packets. The one or more antennas 365 may receive electro-magnetic signals associated with the first plurality of packets and convert the electro-magnetic signals into electrical signals. The RF front end 388 may filter and/or amplify the electrical signals. The RF front end 388 may send the electrical signals to the transceiver 302 or the receiver 306. The transceiver 302 or the receiver 306 may convert the electrical signals into digital signals and send to the communication component 322.

In certain implementations, the processor 312, the modem 320, the communication component 322, the transceiver 302, the receiver 306, the transmitter 308, the RF front end 388, and/or the subcomponents of the RF front end 388 may be configured to and/or may define means for receiving, from a transmitting device, a first plurality of packets.

At 1810, the method 1800 may determine a first checksum failure associated with the first plurality of packets. For example, the determination component 324, the modem 320, and/or the processor 312 of the BS 105 may determine a first checksum failure associated with the first plurality of packets.

In certain implementations, the processor 312, the modem 320, the determination component 324, the transceiver 302, the receiver 306, the transmitter 308, the RF front end 388, and/or the subcomponents of the RF front end 388 may be configured to and/or may define means for determining a first checksum failure associated with the first plurality of packets.

At 1815, the method 1800 may transmit a first memory reset request in response to determining the first checksum failure, wherein the first memory reset request includes one or more recent sequence numbers of the first plurality of packets. For example, the communication component 322, the modem 320, and/or the processor 312 of the BS 105 may transmit a first memory reset request in response to determining the first checksum failure, wherein the first memory reset request includes one or more recent sequence numbers of the first plurality of packets. The communication component 322 may send the first memory reset request to the transceiver 302 or the transmitter 308. The transceiver 302 or the transmitter 308 may convert the first memory reset request to electrical signals and send to the RF front end 388. The RF front end 388 may filter and/or amplify the electrical signals. The RF front end 388 may send the electrical signals as electro-magnetic signals via the one or more antennas 365.

In certain implementations, the processor 312, the modem 320, the communication component 322, the transceiver 302, the receiver 306, the transmitter 308, the RF front end 388, and/or the subcomponents of the RF front end 388 may be configured to and/or may define means for transmitting a first memory reset request in response to determining the first checksum failure, wherein the first memory reset request includes one or more recent sequence numbers of the first plurality of packets.

At block 1820, the method 1800 may receive, from the transmitting device, a second plurality of packets. For example, the communication component 322, the modem 320, and/or the processor 312 of the BS 105 may receive, from the transmitting device, a second plurality of packets. In an aspect, the data information in the first plurality of packets may be the same or different than the data information in the second plurality of packets. For example, the data information in the second plurality of packets may include redundant data information of the first plurality of packets. Alternatively, the data information in the second plurality of packets may be different than the data information of the first plurality of packets. The one or more antennas 365 may receive electro-magnetic signals associated with the first plurality of packets and convert the electro-magnetic signals into electrical signals. The RF front end 388 may filter and/or amplify the electrical signals. The RF front end 388 may send the electrical signals to the transceiver 302 or the receiver 306. The transceiver 302 or the receiver 306 may convert the electrical signals into digital signals and send to the communication component 322.

In certain implementations, the processor 312, the modem 320, the communication component 322, the transceiver 302, the receiver 306, the transmitter 308, the RF front end 388, and/or the subcomponents of the RF front end 388 may be configured to and/or may define means for receiving, from the transmitting device, a second plurality of packets.

At 1825, the method 1800 may determine a second checksum failure associated with the second plurality of packets within a threshold time of transmitting the first memory reset request. For example, the determination component 324, the modem 320, and/or the processor 312 of the BS 105 may determine a second checksum failure associated with the second plurality of packets within a threshold time of transmitting the first memory reset request.

In certain implementations, the processor 312, the modem 320, the determination component 324, the transceiver 302, the receiver 306, the transmitter 308, the RF front end 388, and/or the subcomponents of the RF front end 388 may be configured to and/or may define means for determining a second checksum failure associated with the second plurality of packets within a threshold time of transmitting the first memory reset request.

At 1830, the method 1800 may refrain from transmitting a second memory reset request in response to determining the second checksum failure. For example, the determination component 324, the modem 320, and/or the processor 312 of the BS 105 may refrain from transmitting a second memory reset request in response to determining the second checksum failure.

In certain implementations, the processor 312, the modem 320, the determination component 324, the transceiver 302, the receiver 306, the transmitter 308, the RF front end 388, and/or the subcomponents of the RF front end 388 may be configured to and/or may define means for refraining from transmitting a second memory reset request in response to determining the second checksum failure.

Figure 19:
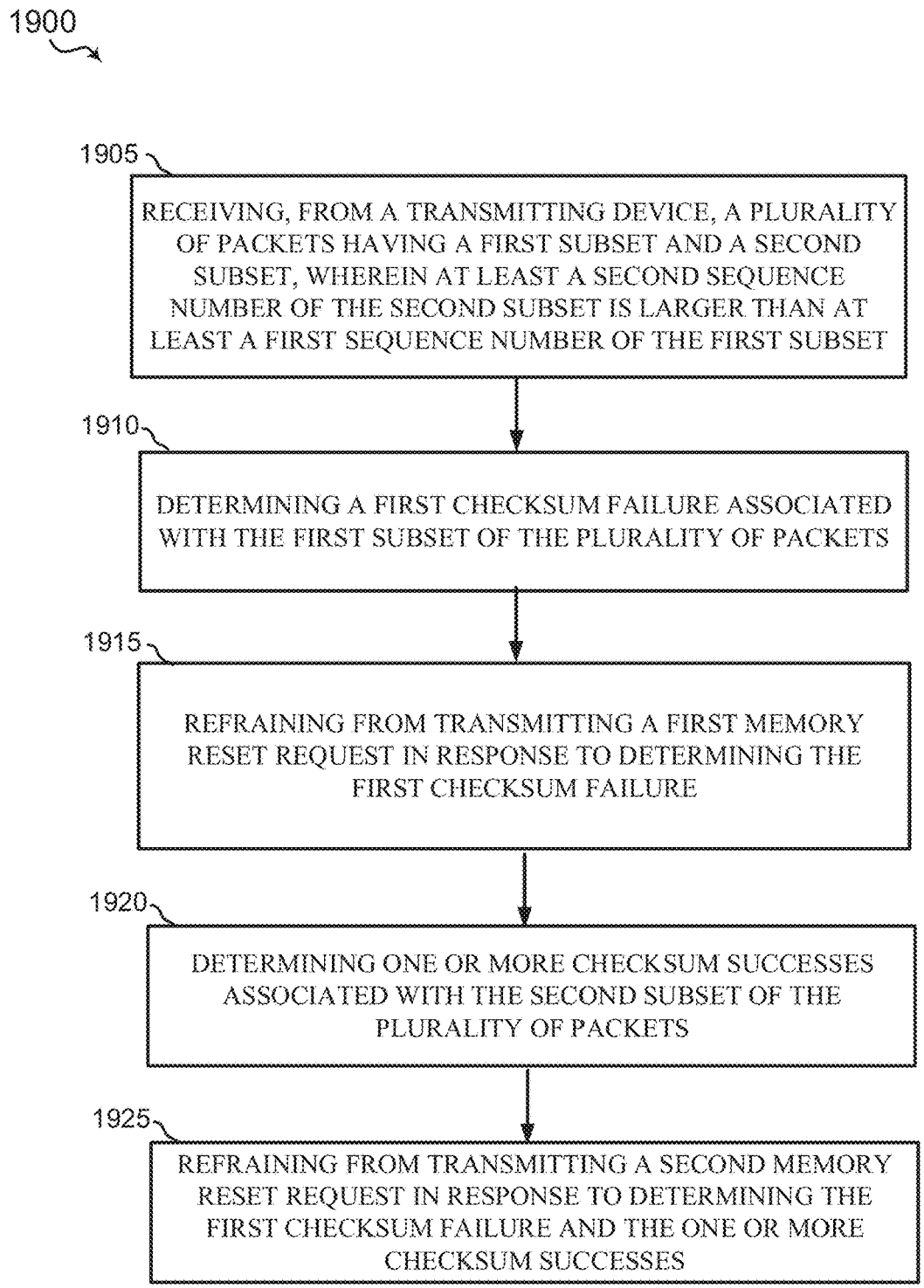
FIG. 19 is a process flow diagram of another example of a method for refraining from transmitting a memory reset request performed by a receiving device.

Referring to FIG. 19, an example of a method 1900 for refraining from transmitting a memory reset request may be performed by a receiving device (e.g., BS 105 or UE 110) or components of the receiving device, such as one or more of the processor 212, the memory 216, the applications 275, the modem 220, the transceiver 202 and/or its subcomponents, the RF front end 288 and/or its subcomponents, the communication component 222, and/or the determination component 224 of the UE 110 and/or one or more of the processor 312, the memory 316, the applications 375, the modem 320, the transceiver 302 and/or its subcomponents, the RF front end 388 and/or its subcomponents, the communication component 322, and/or the determination component 324 of the BS 105 in the wireless communication network 100.

At block 1905, the method 1900 may receive, from a transmitting device, a plurality of packets having a first subset and a second subset, wherein at least a second sequence number of the second subset is larger than at least a first sequence number of the first subset. For example, the communication component 322, the modem 320, and/or the processor 312 of the BS 105 may receive, from a transmitting device, a plurality of packets having a first subset and a second subset, wherein at least a second sequence number of the second subset is larger than at least a first sequence number of the first subset. The one or more antennas 365 may receive electro-magnetic signals associated with the first plurality of packets and convert the electro-magnetic signals into electrical signals. The RF front end 388 may filter and/or amplify the electrical signals. The RF front end 388 may send the electrical signals to the transceiver 302 or the receiver 306. The transceiver 302 or the receiver 306 may convert the electrical signals into digital signals and send to the communication component 322.

In certain implementations, the processor 312, the modem 320, the communication component 322, the transceiver 302, the receiver 306, the transmitter 308, the RF front end 388, and/or the subcomponents of the RF front end 388 may be configured to and/or may define means for receiving, from a transmitting device, a plurality of packets having a first subset and a second subset, wherein at least a second sequence number of the second subset is larger than at least a first sequence number of the first subset.

At 1910, the method 1900 may determine a first checksum failure associated with the first subset of the plurality of packets. For example, the determination component 324, the modem 320, and/or the processor 312 of the BS 105 may determine a first checksum failure associated with the first subset of the plurality of packets.

In certain implementations, the processor 312, the modem 320, the determination component 324, the transceiver 302, the receiver 306, the transmitter 308, the RF front end 388, and/or the subcomponents of the RF front end 388 may be configured to and/or may define means for determining a first checksum failure associated with the first subset of the plurality of packets.

At 1915, the method 1900 may refrain from transmitting a first memory reset request in response to determining the first checksum failure. For example, the determination component 324, the modem 320, and/or the processor 312 of the BS 105 may refrain from transmitting a first memory reset request in response to determining the first checksum failure.

In certain implementations, the processor 312, the modem 320, the determination component 324, the transceiver 302, the receiver 306, the transmitter 308, the RF front end 388, and/or the subcomponents of the RF front end 388 may be configured to and/or may define means for refraining from transmitting a first memory reset request in response to determining the first checksum failure.

At 1920, the method 1900 may determine one or more checksum successes associated with the second subset of the plurality of packets. For example, the determination component 324, the modem 320, and/or the processor 312 of the BS 105 may determine one or more checksum successes associated with the second subset of the plurality of packets.

In certain implementations, the processor 312, the modem 320, the determination component 324, the transceiver 302, the receiver 306, the transmitter 308, the RF front end 388, and/or the subcomponents of the RF front end 388 may be configured to and/or may define means for determining one or more checksum successes associated with the second subset of the plurality of packets.

At 1925, the method 1900 may refrain from transmitting a second memory reset request in response to determining the first checksum failure and the one or more checksum successes. For example, the determination component 324, the modem 320, and/or the processor 312 of the BS 105 may refrain from transmitting a second memory reset request in response to determining the first checksum failure and the one or more checksum successes.

In certain implementations, the processor 312, the modem 320, the determination component 324, the transceiver 302, the receiver 306, the transmitter 308, the RF front end 388, and/or the subcomponents of the RF front end 388 may be configured to and/or may define means for refraining from transmitting a second memory reset request in response to determining the first checksum failure and the one or more checksum successes.

ADDITIONAL IMPLEMENTATIONS

Aspects of the present disclosure include methods by a transmitting device for transmitting, to a receiving device, a first plurality of packets immediately after a first compression memory reset, wherein the first plurality of packets is transmitted as a burst transmission, transmitting, to the receiving device, a second plurality of packets different than the first plurality of packets, receiving, from the receiving device, a memory reset request associated with the second plurality of packets for a second compression memory reset, wherein the memory reset request comprises one or more recent sequence numbers of the second plurality of packets, determining whether at least one of the one or more recent sequence numbers is less than or greater than or equal to at least one of one or more reset sequence numbers of the first plurality of packets, and refraining from performing a second compression memory reset in response to determining that the at least one of the one or more recent sequence numbers is less than at least one of one or more reset sequence numbers of the first plurality of packets.

Aspects of the present disclosure include the method above, further comprising performing the second compression memory reset in response to determining that the at least one of the one or more recent sequence numbers is greater than or equal to at least one of one or more reset sequence numbers of the first plurality of packets.

Aspects of the present disclosure include any of the methods above, wherein transmitting the first plurality of packets comprises transmitting an indicator indicating the first compression memory reset.

Aspects of the present disclosure include any of the methods above, wherein transmitting the first plurality of packets comprises transmitting a checksum value associated with the first plurality of packets.

Aspects of the present disclosure include any of the methods above, wherein transmitting the second plurality of packets comprises transmitting a checksum value associated with the second plurality of packets.

Aspects of the present disclosure include any of the methods above, further comprising compressing the first plurality of packets into a first plurality of compressed packets and the second plurality of packets into a second plurality of compressed packets, wherein transmitting the first plurality of packets comprises transmitting the first plurality of compressed packets, and wherein transmitting the second plurality of packets comprises transmitting the second plurality of compressed packets.

Aspects of the present disclosure include any of the methods above, wherein compressing the at least one of the plurality of packets or the second plurality of packets comprises compressing using one of a deflating algorithm, LZ77 algorithm or Huffman coding.

Aspects of the present disclosure include any of the methods above, wherein the one or more reset sequence numbers is a last reset sequence number.

Aspects of the present disclosure include any of the methods above, wherein the one or more recent sequence numbers includes a latest processed sequence number.

Aspects of the present disclosure include any of the methods above, wherein the memory reset request includes a PDCP bearer identification ID.

Aspects of the present disclosure include any of the methods above, wherein the memory reset request is one of a packet data convergence protocol (PDCP) control protocol data unit (PDU), a radio link control PDU, a signaling radio bearer (SRB) in radio resource control (RRC), or a medium access control (MAC) control element (CE).

Other aspects of the present disclosure include a transmitting device having a memory comprising instructions, a transceiver, and one or more processors operatively coupled with the memory and the transceiver, the one or more processors configured to execute instructions in the memory to transmit, to a receiving device, a first plurality of packets immediately after a first compression memory reset, wherein the first plurality of packets is transmitted as a burst transmission, transmit, to the receiving device, a second plurality of packets different than the first plurality of packets, receiving, from the receiving device, a memory reset request associated with the second plurality of packets for a second compression memory reset, wherein the memory reset request comprises one or more recent sequence numbers of the second plurality of packets, determining whether at least one of the one or more recent sequence numbers is less than or greater than or equal to at least one of one or more reset sequence numbers of the first plurality of packets, and refraining from performing a second compression memory reset in response to determining that the at least one of the one or more recent sequence numbers is less than at least one of one or more reset sequence numbers of the first plurality of packets.

Aspects of the present disclosure include the transmitting device above, wherein the one or more processors are further configured to perform the second compression memory reset in response to determining that the at least one of the one or more recent sequence numbers is greater than or equal to at least one of one or more reset sequence numbers of the first plurality of packets.

Aspects of the present disclosure include any of the transmitting devices above, wherein the one or more processors are further configured to transmit an indicator indicating the first compression memory reset.

Aspects of the present disclosure include any of the transmitting devices above, wherein the one or more processors are further configured to transmit a checksum value associated with the first plurality of packets.

Aspects of the present disclosure include any of the transmitting devices above, wherein the one or more processors are further configured to transmit a checksum value associated with the second plurality of packets.

Aspects of the present disclosure include any of the transmitting devices above, wherein the one or more processors are further configured to compress the first plurality of packets into a first plurality of compressed packets and the second plurality of packets into a second plurality of compressed packets, wherein transmitting the first plurality of packets comprises transmitting the first plurality of compressed packets, and wherein transmitting the second plurality of packets comprises transmitting the second plurality of compressed packets.

Aspects of the present disclosure include any of the transmitting devices above, wherein the one or more processors are further configured to compress using one of a deflating algorithm, LZ77 algorithm or Huffman coding.

Aspects of the present disclosure include any of the transmitting devices above, wherein the one or more reset sequence numbers is a last reset sequence number.

Aspects of the present disclosure include any of the transmitting devices above, wherein the one or more recent sequence numbers includes a latest processed sequence number.

Aspects of the present disclosure include any of the transmitting devices above, wherein the memory reset request includes a PDCP bearer identification ID.

Aspects of the present disclosure include any of the transmitting devices above, wherein the memory reset request is one of a packet data convergence protocol (PDCP) control protocol data unit (PDU), a radio link control PDU, a signaling radio bearer (SRB) in radio resource control (RRC), or a medium access control (MAC) control element (CE).

An aspect of the present disclosure includes a transmitting device including means for transmitting, to a receiving device, a first plurality of packets immediately after a first compression memory reset, wherein the first plurality of packets is transmitted as a burst transmission, transmitting, to the receiving device, a second plurality of packets different than the first plurality of packets, receiving, from the receiving device, a memory reset request associated with the second plurality of packets for a second compression memory reset, wherein the memory reset request comprises one or more recent sequence numbers of the second plurality of packets, determining whether at least one of the one or more recent sequence numbers is less than or greater than or equal to at least one of one or more reset sequence numbers of the first plurality of packets, and refraining from performing a second compression memory reset in response to determining that the at least one of the one or more recent sequence numbers is less than at least one of one or more reset sequence numbers of the first plurality of packets.

Aspects of the present disclosure include the transmitting device above, further comprising performing the second compression memory reset in response to determining that the at least one of the one or more recent sequence numbers is greater than or equal to at least one of one or more reset sequence numbers of the first plurality of packets.

Aspects of the present disclosure include any of the transmitting devices above, wherein means for transmitting the first plurality of packets comprises transmitting an indicator indicating the first compression memory reset.

Aspects of the present disclosure include any of the transmitting devices above, wherein means for transmitting the first plurality of packets comprises transmitting a checksum value associated with the first plurality of packets.

Aspects of the present disclosure include any of the transmitting devices above, wherein means for transmitting the second plurality of packets comprises transmitting a checksum value associated with the second plurality of packets.

Aspects of the present disclosure include any of the transmitting devices above, further comprising compressing the first plurality of packets into a first plurality of compressed packets and the second plurality of packets into a second plurality of compressed packets, wherein transmitting the first plurality of packets comprises transmitting the first plurality of compressed packets, and wherein transmitting the second plurality of packets comprises transmitting the second plurality of compressed packets.

Aspects of the present disclosure include any of the transmitting devices above, wherein means for compressing the at least one of the plurality of packets or the second plurality of packets comprises compressing using one of a deflating algorithm, LZ77 algorithm or Huffman coding.

Aspects of the present disclosure include any of the transmitting devices above, wherein the one or more reset sequence numbers is a last reset sequence number.

Aspects of the present disclosure include any of the transmitting devices above, wherein the one or more recent sequence numbers includes a latest processed sequence number.

Aspects of the present disclosure include any of the transmitting devices above, wherein the memory reset request includes a PDCP bearer identification ID.

Aspects of the present disclosure include any of the transmitting devices above, wherein the memory reset request is one of a packet data convergence protocol (PDCP) control protocol data unit (PDU), a radio link control PDU, a signaling radio bearer (SRB) in radio resource control (RRC), or a medium access control (MAC) control element (CE).

Some aspects of the present disclosure include non-transitory computer readable media having instructions stored therein that, when executed by one or more processors of a transmitting device, cause the one or more processors to transmit, to a receiving device, a first plurality of packets immediately after a first compression memory reset, transmit, wherein the first plurality of packets is transmitted as a burst transmission, to the receiving device, a second plurality of packets different than the first plurality of packets, receiving, from the receiving device, a memory reset request associated with the second plurality of packets for a second compression memory reset, wherein the memory reset request comprises one or more recent sequence numbers of the second plurality of packets, determining whether at least one of the one or more recent sequence numbers is less than or greater than or equal to at least one of one or more reset sequence numbers of the first plurality of packets, and refraining from performing a second compression memory reset in response to determining that the at least one of the one or more recent sequence numbers is less than at least one of one or more reset sequence numbers of the first plurality of packets.

Aspects of the present disclosure include the non-transitory computer readable medium above, further comprising instructions, when executed by the one or more processors, cause the one or more processors to perform the second compression memory reset in response to determining that the at least one of the one or more recent sequence numbers is greater than or equal to at least one of one or more reset sequence numbers of the first plurality of packets.

Aspects of the present disclosure include any of the non-transitory computer readable media above, wherein the instructions for transmitting the first plurality of packets further comprising instructions, when executed by the one or more processors, cause the one or more processors to transmit an indicator indicating the first compression memory reset.

Aspects of the present disclosure include any of the non-transitory computer readable media above, wherein the instructions for transmitting the first plurality of packets further comprising instructions, when executed by the one or more processors, cause the one or more processors to transmit a checksum value associated with the first plurality of packets.

Aspects of the present disclosure include any of the non-transitory computer readable media above, wherein the instructions for transmitting the second plurality of packets further comprising instructions, when executed by the one or more processors, cause the one or more processors to transmit a checksum value associated with the second plurality of packets.

Aspects of the present disclosure include any of the non-transitory computer readable media above, further comprising instructions, when executed by the one or more processors, cause the one or more processors to compress the first plurality of packets into a first plurality of compressed packets and the second plurality of packets into a second plurality of compressed packets, wherein transmitting the first plurality of packets comprises transmitting the first plurality of compressed packets, and wherein transmitting the second plurality of packets comprises transmitting the second plurality of compressed packets.

Aspects of the present disclosure include any of the non-transitory computer readable media above, wherein the instructions for compressing the at least one of the plurality of packets or the second plurality of packets further comprising instructions, when executed by the one or more processors, cause the one or more processors to compress using one of a deflating algorithm, LZ77 algorithm or Huffman coding.

Aspects of the present disclosure include any of the non-transitory computer readable media above, wherein the one or more reset sequence numbers is a last reset sequence number.

Aspects of the present disclosure include any of the non-transitory computer readable media above, wherein the one or more recent sequence numbers includes a latest processed sequence number.

Aspects of the present disclosure include any of the non-transitory computer readable media above, wherein the memory reset request includes a PDCP bearer identification ID.

Aspects of the present disclosure include any of the non-transitory computer readable media above, wherein the memory reset request is one of a packet data convergence protocol (PDCP) control protocol data unit (PDU), a radio link control PDU, a signaling radio bearer (SRB) in radio resource control (RRC), or a medium access control (MAC) control element (CE).

Aspects of the present disclosure include a method, a receiving device, and/or a non-transitory computer readable medium for receiving, from the transmitting device, a plurality of packets, determining a checksum failure associated with the plurality of packets, and transmitting, to the transmitting device, a memory reset request associated with the plurality of packets for a compression memory reset in response to determining the checksum failure, wherein the memory reset request comprises one or more recent sequence numbers of the plurality of packets.

Any of the aspects above, wherein receiving the first plurality of packets comprises receiving an indicator indicating the first compression memory reset.

Any of the aspects above, wherein receiving the first plurality of packets comprises receiving a checksum value associated with the first plurality of packets.

Any of the aspects above, wherein receiving the plurality of packets comprises receiving a checksum value associated with the plurality of packets.

Any of the aspects above, wherein the one or more recent sequence numbers includes a latest processed sequence number.

Any of the aspects above, wherein the memory reset request includes a PDCP bearer identification ID.

Any of the aspects above, wherein the memory reset request is one of a packet data convergence protocol (PDCP) control protocol data unit (PDU), a radio link control PDU, signaling radio bearer (SRB) in radio resource control (RRC), or a medium access control (MAC) control element (CE).

Any of the aspects above, wherein transmitting the memory reset request comprises transmitting the memory reset request without any buffer threshold restrictions.

Aspects of the present disclosure include a method, a receiving device, and/or a non-transitory computer readable medium for receiving, from a transmitting device, a first plurality of packets, receiving, from the transmitting device, a second plurality of packets immediately after a first compression memory reset, wherein the second plurality of packets is different than the first plurality of packets, determining a checksum failure associated with the second plurality of packets, determining whether at least one of one or more recent sequence numbers of the first plurality of packets is less than or greater than or equal to at least one of one or more reset sequence numbers of the second plurality of packets, and refraining from transmitting a memory reset request for a second compression memory reset associated with the checksum failure in response to determining that the at least one of one or more recent sequence numbers is less than the at least one of one or more reset sequence numbers Any of the aspects above, further comprising transmitting the memory reset request for the second compression memory reset associated with the checksum failure in response to determining that the at least one of one or more recent sequence numbers is greater than or equal to the at least one of one or more reset sequence numbers.

Any of the aspects above, further comprising triggering a reordering timer, failing to decompress at least one of the second plurality of packets after an expiration of the reordering timer, and wherein determining the checksum failure comprises determining the checksum failure after the reordering timer expires.

Any of the aspects above, wherein receiving the second plurality of packets comprises receiving an indicator indicating the first compression memory reset.

Any of the aspects above, wherein receiving the first plurality of packets comprises receiving a checksum value associated with the first plurality of packets.

Any of the aspects above, wherein receiving the second plurality of packets comprises receiving a checksum value associated with the second plurality of packets.

Any of the aspects above, further comprising decompressing the first plurality of packets into a first plurality of decompressed packets and the second plurality of packets into a second plurality of decompressed packets.

Any of the aspects above, wherein decompressing the at least one of the plurality of packets or the second plurality of packets comprises decompressing using one of a deflating algorithm, LZ77 algorithm or Huffman coding.

Any of the aspects above, wherein the one or more reset sequence numbers is a last reset sequence number.

Any of the aspects above, wherein the one or more recent sequence numbers includes a latest processed sequence number.

Aspects of the present disclosure include a method, a receiving device, and/or a non-transitory computer readable medium for receiving, from a transmitting device, a plurality of packets having a first subset and a second subset, wherein at least a second sequence number of the second subset is larger than at least a first sequence number of the first subset, determining a first checksum failure associated with the first subset of the plurality of packets, refraining from transmitting a first memory reset request in response to determining the first checksum failure, determining a checksum success or a second checksum failure associated with the second subset of the plurality of packets, and transmitting a second memory reset request in response to determining the first checksum failure and one of the checksum success or the second checksum failure.

Any of the aspects above, wherein the second memory reset request includes a PDCP bearer identification ID.

Any of the aspects above, wherein the second memory reset request is one of a packet data convergence protocol (PDCP) control protocol data unit (PDU), a radio link control PDU, signaling radio bearer (SRB) in radio resource control (RRC), or a medium access control (MAC) control element (CE).

Any of the aspects above, wherein transmitting the second memory reset request comprises transmitting the second memory reset request without any buffer threshold restrictions.

Aspects of the present disclosure include a method, a receiving device, and/or a non-transitory computer readable medium for receiving, from a transmitting device, a first plurality of packets, determining a first checksum failure associated with the first plurality of packets, transmitting a first memory reset request in response to determining the first checksum failure, wherein the first memory reset request includes one or more recent sequence numbers of the first plurality of packets, receiving, from the transmitting device, a second plurality of packets, determining a second checksum failure associated with the second plurality of packets within a threshold time of transmitting the first memory reset request, and refraining from transmitting a second memory reset request in response to determining the second checksum failure.

Any of the aspects above, wherein the first memory reset request includes a PDCP bearer identification ID.

Any of the aspects above, wherein the first memory reset request is one of a packet data convergence protocol (PDCP) control protocol data unit (PDU), a radio link control PDU, signaling radio bearer (SRB) in radio resource control (RRC), or a medium access control (MAC) control element (CE).

Any of the aspects above, wherein transmitting the first memory reset request comprises transmitting the first memory reset request without any buffer threshold restrictions.

Aspects of the present disclosure include a method, a receiving device, and/or a non-transitory computer readable medium for receiving, from a transmitting device, a plurality of packets having a first subset and a second subset, wherein at least a second sequence number of the second subset is larger than at least a first sequence number of the first subset, determining a first checksum failure associated with the first subset of the plurality of packets, refraining from transmitting a first memory reset request in response to determining the first checksum failure, determining one or more checksum successes associated with the second subset of the plurality of packets, and refraining from transmitting a second memory reset request in response to determining the first checksum failure and the one or more checksum successes.

The above detailed description set forth above in connection with the appended drawings describes examples and does not represent the only examples that may be implemented or that are within the scope of the claims. The term "example," when used in this description, means "serving as an example, instance, or illustration," and not "preferred" or "advantageous over other examples." The detailed description includes specific details for the purpose of providing an understanding of the described techniques. These techniques, however, may be practiced without these specific details. For example, changes may be made in the function and arrangement of elements discussed without departing from the scope of the disclosure. Also, various examples may omit, substitute, or add various procedures or components as appropriate. For instance, the methods described may be performed in an order different from that described, and various steps may be added, omitted, or combined. Also, features described with respect to some examples may be combined in other examples. In some instances, well-known structures and apparatuses are shown in block diagram form in order to avoid obscuring the concepts of the described examples.

It should be noted that the techniques described herein may be used for various wireless communication networks such as CDMA, TDMA, FDMA, OFDMA, SC-FDMA, and other systems. The terms "system" and "network" are often used interchangeably. A CDMA system may implement a radio technology such as CDMA2000, Universal Terrestrial Radio Access (UTRA), etc. CDMA2000 covers IS-2000, IS-95, and IS-856 standards. IS-2000 Releases 0 and A are commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM). An OFDMA system may implement a radio technology such as Ultra Mobile Broadband (UMB), Evolved UTRA (E-UTRA), IEEE 802.11 (Wi-Fi), IEEE 802.16 (WiMAX), IEEE 802.20, Flash-OFDM™, etc. UTRA and E-UTRA are part of Universal Mobile Telecommunication System (UMTS). 3GPP LTE and LTE-Advanced (LTE-A) are new releases of UMTS that use E-UTRA. UTRA, E-UTRA, UMTS, LTE, LTE-A, and GSM are described in documents from an organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies, including cellular (e.g., LTE) communications over a shared radio frequency spectrum band. The description herein, however, describes an LTE/LTE-A system or 5G system for purposes of example, and LTE terminology is used in much of the description below, although the techniques may be applicable other next generation communication systems.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, computer-executable code or instructions stored on a computer-readable medium, or any combination thereof.

The various illustrative blocks and components described in connection with the disclosure herein may be implemented or performed with a specially-programmed device, such as but not limited to a processor, a digital signal processor (DSP), an ASIC, a FPGA or other programmable logic device, a discrete gate or transistor logic, a discrete hardware component, or any combination thereof designed to perform the functions described herein. A specially-programmed processor may be a microprocessor, but in the alternative, the processor may be any conventional processor, controller, microcontroller, or state machine. A specially-programmed processor may also be implemented as a combination of computing devices, e.g., a combination of a DSP and a microprocessor, multiple microprocessors, one or more microprocessors in conjunction with a DSP core, or any other such configuration.

The functions described herein may be implemented in hardware, software executed by a processor, firmware, or any combination thereof. If implemented in software executed by a processor, the functions may be stored on or transmitted over as one or more instructions or code on a non-transitory computer-readable medium. Other examples and implementations are within the scope and spirit of the disclosure and appended claims. For example, due to the nature of software, functions described above may be implemented using software executed by a specially programmed processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C).

Computer-readable media includes both computer storage media and communication media including any medium that facilitates transfer of a computer program from one place to another. A storage medium may be any available medium that may be accessed by a general purpose or special purpose computer. By way of example, and not limitation, computer-readable media may comprise RAM, ROM, EEPROM, CD-ROM or other optical disk storage, magnetic disk storage or other magnetic storage devices, or any other medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A method of wireless communication by a transmitting device, comprising:
    transmitting a first plurality of packets immediately after a first compression memory reset, wherein the first plurality of packets is transmitted as a burst transmission, wherein the first plurality of packets are associated with one or more reset sequence numbers;
    transmitting a second plurality of packets different than the first plurality of packets, wherein the second plurality of packets are associated with one or more recent sequence numbers;
    receiving a memory reset request associated with the second plurality of packets, wherein the memory reset request is for a second compression memory reset, and wherein the memory reset request comprises the one or more recent sequence numbers of the second plurality of packets; and
    refraining from performing the second compression memory reset based on at least one recent sequence number of the one or more recent sequence numbers being less than at least one of the one or more reset sequence numbers of the first plurality of packets.

2. The method of claim 1, further comprising performing the second compression memory reset based on the one or more recent sequence numbers being greater than or equal the one or more reset sequence numbers of the first plurality of packets.

3. The method of claim 1, wherein transmitting the first plurality of packets comprises transmitting an indicator indicating the first compression memory reset.

4. The method of claim 1, wherein transmitting the first plurality of packets comprises transmitting a checksum value associated with the first plurality of packets.

5. The method of claim 1, wherein transmitting the second plurality of packets comprises transmitting a checksum value associated with the second plurality of packets.

6. The method of claim 1, further comprising compressing the first plurality of packets into a first plurality of compressed packets and compressing the second plurality of packets into a second plurality of compressed packets;
    wherein transmitting the first plurality of packets comprises transmitting the first plurality of compressed packets; and
    wherein transmitting the second plurality of packets comprises transmitting the second plurality of compressed packets.

7. The method of claim 6, wherein compressing the first plurality of packets or compressing the second plurality of packets comprises compressing the first plurality of packets or compressing the second plurality of packets using one of a deflating algorithm, LZ77 algorithm, or Huffman coding.

8. The method of claim 1, wherein the one or more reset sequence numbers is a last reset sequence number.

9. The method of claim 1, wherein the one or more recent sequence numbers includes a latest processed sequence number.

10. The method of claim 9, wherein the memory reset request includes a packet data convergence protocol (PDCP) bearer identification ID.

11. The method of claim 10, wherein the memory reset request is one of a PDCP control protocol data unit (PDU), a radio link control PDU, a signaling radio bearer (SRB) in radio resource control (RRC), or a medium access control (MAC) control element (CE).

12. A device, comprising:
a memory comprising instructions;
a transceiver; and
one or more processors operatively coupled with the memory and the transceiver, the one or more processors configured to:
  transmit, via the transceiver, a first plurality of packets immediately after a first compression memory reset, wherein the first plurality of packets is transmitted as a burst transmission, wherein the first plurality of packets are associated with one or more reset sequence numbers;
  transmit, via the transceiver, a second plurality of packets different than the first plurality of packets, wherein the second plurality of packets are associated with one or more recent sequence numbers;
  receive, via the transceiver, a memory reset request associated with the second plurality of packets, wherein the memory reset request is for a second compression memory reset, and wherein the memory reset request comprises the one or more recent sequence numbers of the second plurality of packets; and
  refrain from performing the second compression memory reset based on at least one recent sequence number of the one or more recent sequence numbers being less than at least one of the one or more reset sequence numbers of the first plurality of packets.

13. The device of claim 12, wherein the one or more processors are further configured to:
  perform the second compression memory reset based on the one or more recent sequence numbers being greater than or equal to the one or more reset sequence numbers of the first plurality of packets.

14. The device of claim 12, wherein the one or more processors are further configured to:
  transmit an indicator indicating the first compression memory reset.

15. The device of claim 12, wherein the one or more processors are further configured to:
  transmit a checksum value associated with the first plurality of packets.

16. The device of claim 12, wherein the one or more processors are further configured to:
  transmit a checksum value associated with the second plurality of packets.

17. The device of claim 12, wherein the one or more processors are further configured to:
  compress the first plurality of packets into a first plurality of compressed packets and compress the second plurality of packets into a second plurality of compressed packets;
  wherein to transmit the first plurality of packets, the one or more processors are configured to transmit, via the transceiver, the first plurality of compressed packets; and
  wherein to transmit the second plurality of packets, the one or more processors are configured to transmit, via the transceiver, the second plurality of compressed packets.

18. The device of claim 17, wherein the one or more processors are further configured to:
  compress the first plurality of packets or compress the second plurality of packets using one of a deflating algorithm, LZ77 algorithm, or Huffman coding.

19. The device of claim 12, wherein:
  the one or more reset sequence numbers is a last reset sequence number.

20. The device of claim 12, wherein:
  the one or more recent sequence numbers includes a latest processed sequence number.

21. The device of claim 20, wherein:
  the memory reset request includes a packet data convergence protocol (PDCP) bearer identification ID.

22. The device of claim 21, wherein:
  the memory reset request is one of a PDCP control protocol data unit (PDU), a radio link control PDU, a signaling radio bearer (SRB) in radio resource control (RRC), or a medium access control (MAC) control element (CE).

23. A non-transitory computer readable medium having instructions stored therein that, when executed by a device, cause the device to:
  transmit, to a receiving device, a first plurality of packets immediately after a first compression memory reset, wherein the first plurality of packets is transmitted as a burst transmission, wherein the first plurality of packets are associated with one or more reset sequence numbers;
  transmit, to the receiving device, a second plurality of packets different than the first plurality of packets, wherein the second plurality of packets are associated with one or more recent sequence numbers;
  receive, from the receiving device, a memory reset request associated with the second plurality of packets, wherein the memory reset request is for a second compression memory reset, and wherein the memory reset request comprises the one or more recent sequence numbers of the second plurality of packets; and
  refrain from performing the second compression memory reset based on at least one recent sequence number of the one or more recent sequence numbers being less than at least one of the one or more reset sequence numbers of the first plurality of packets.

24. The non-transitory computer readable medium of claim 23, further comprising instructions, when executed by the device, cause the device to:
  perform the second compression memory reset based on the one or more recent sequence numbers being greater than or equal to the one or more reset sequence numbers of the first plurality of packets.

25. The non-transitory computer readable medium of claim 23, wherein the instructions for transmitting the first plurality of packets further comprise instructions, when executed by the device, cause the device to:
  transmit an indicator indicating the first compression memory reset.

26. The non-transitory computer readable medium of claim 23, wherein the instructions for transmitting the first plurality of packets further comprise instructions, when executed by the device, cause the device to:
  transmit a checksum value associated with the first plurality of packets.

27. The non-transitory computer readable medium of claim 23, wherein the instructions for transmitting the second plurality of packets further comprise instructions, when executed by the device, cause the device to:

transmit a checksum value associated with the second plurality of packets.

28. The non-transitory computer readable medium of claim 23, further comprising instructions, when executed by the device, cause the device to:
compress the first plurality of packets into a first plurality of compressed packets and compress the second plurality of packets into a second plurality of compressed packets;
wherein to transmit the first plurality of packets, the instructions cause the device to transmit, the first plurality of compressed packets; and
wherein to transmit the second plurality of packets, the instructions cause the device to transmit, the second plurality of compressed packets.

29. The non-transitory computer readable medium of claim 28, wherein the instructions for compressing the first plurality of packets or compressing the second plurality of packets further comprise instructions, when executed by the device, cause the device to:
compress the first plurality of packets or compress the second plurality of packets using one of a deflating algorithm, LZ77 algorithm, or Huffman coding.

30. A device, comprising:
means for transmitting a first plurality of packets immediately after a first compression memory reset, wherein the first plurality of packets is transmitted as a burst transmission, wherein the first plurality of packets are associated with one or more reset sequence numbers;
means for transmitting a second plurality of packets different than the first plurality of packets, wherein the second plurality of packets are associated with one or more recent sequence numbers;
means for receiving a memory reset request associated with the second plurality of packets, wherein the memory reset request is for a second compression memory reset, and wherein the memory reset request comprises the one or more recent sequence numbers of the second plurality of packets; and
means for refraining from performing the second compression memory reset based on at least one recent sequence number of the one or more recent sequence numbers being less than at least one of the one or more reset sequence numbers of the first plurality of packets.

* * * * *